United States Patent
Ishii et al.

(10) Patent No.: US 8,471,283 B2
(45) Date of Patent: Jun. 25, 2013

(54) WHITE LED LAMP, BACKLIGHT, LIGHT EMITTING DEVICE, DISPLAY DEVICE AND ILLUMINATION DEVICE

(75) Inventors: Tsutomu Ishii, Yokohama (JP); Hajime Takeuchi, Yokohama (JP); Yasumasa Ooya, Chigasaki (JP); Katsutoshi Nakagawa, Yokohama (JP); Yumi Ito, Yokohama (JP); Masaki Toyoshima, Yokohama (JP); Yasuhiro Shirakawa, Yokohama (JP); Ryo Sakai, Yokohama (JP)

(73) Assignees: Kabushiki Kaisha Toshiba, Tokyo (JP); Toshiba Materials Co., Ltd., Yokohama-Shi (JP)

( * ) Notice: Subject to any disclaimer, the term of this patent is extended or adjusted under 35 U.S.C. 154(b) by 154 days.

(21) Appl. No.: 12/919,287

(22) PCT Filed: Feb. 19, 2009

(86) PCT No.: PCT/JP2009/052863
§ 371 (c)(1),
(2), (4) Date: Aug. 25, 2010

(87) PCT Pub. No.: WO2009/107535
PCT Pub. Date: Sep. 3, 2009

(65) Prior Publication Data
US 2011/0006334 A1 Jan. 13, 2011

(30) Foreign Application Priority Data

Feb. 25, 2008 (JP) .................................. 2008-043344
Nov. 28, 2008 (JP) .................................. 2008-304117
Dec. 2, 2008 (JP) .................................. 2008-307611

(51) Int. Cl.
*H01L 33/50* (2010.01)

(52) U.S. Cl.
USPC ................................. 257/98; 257/89; 313/503

(58) Field of Classification Search
USPC .......................................... 257/78, 79, 98, 100
See application file for complete search history.

(56) References Cited

U.S. PATENT DOCUMENTS 4,781,890 A * 11/1988 Arai et al. ..................... 422/428
7,961,762 B2 * 6/2011 Ishii et al. .......................... 372/5

(Continued)

FOREIGN PATENT DOCUMENTS

| JP | 2000 49380 | 2/2000 |
| JP | 2005 86051 | 3/2005 |

(Continued)

OTHER PUBLICATIONS

International Preliminary Report on Patentability issued Oct. 5, 2010 in International Application No. PCT/JP2009/052863.

(Continued)

*Primary Examiner* — Wael M. Fahmy
*Assistant Examiner* — Suian Tang
(74) *Attorney, Agent, or Firm* — Oblon, Spivak, McClelland, Maier & Neustadt, L.L.P.

(57) ABSTRACT

A white LED lamp including: a conductive portion; a light emitting diode chip mounted on the conductive portion, for emitting a primary light having a peak wavelength of 360 nm to 420 nm; a transparent resin layer including a first hardened transparent resin, for sealing the light emitting diode chip; and a phosphor layer covering the transparent resin layer, the phosphor layer being formed by dispersing a phosphor powder into a second hardened transparent resin, and the phosphor powder receiving the primary light and radiating a secondary light having a wavelength longer than that of the primary light. An energy of the primary light contained in the radiated secondary light is 0.4 mW/lm or less. In the white LED lamp, a backlight, and an illumination device using the white LED lamp an amount of UV light to be contained in the released light and an amount of heat to be generated from the lamp are decreased to be small.

17 Claims, 7 Drawing Sheets

U.S. PATENT DOCUMENTS

| | | | |
|---|---|---|---|
| 2004/0245532 A1* | 12/2004 | Maeda et al. | 257/89 |
| 2005/0189863 A1 | 9/2005 | Nagatomi et al. | |
| 2006/0124954 A1* | 6/2006 | Akaishi | 257/99 |
| 2006/0262243 A1 | 11/2006 | Lester et al. | |
| 2007/0052342 A1* | 3/2007 | Masuda et al. | 313/487 |
| 2007/0194693 A1 | 8/2007 | Saito et al. | |
| 2007/0205712 A1* | 9/2007 | Radkov et al. | 313/503 |
| 2007/0262702 A1* | 11/2007 | Fujita et al. | 313/503 |
| 2009/0052157 A1 | 2/2009 | Katabe | |

FOREIGN PATENT DOCUMENTS

| | | |
|---|---|---|
| JP | 2005 191197 | 7/2005 |
| JP | 2005 228833 | 8/2005 |
| JP | 2005 239985 | 9/2005 |
| JP | 2006 278416 | 10/2006 |
| JP | 2006 323391 | 11/2006 |
| JP | 2007-016196 A | 1/2007 |
| JP | 2007 59758 | 3/2007 |
| JP | 2007 67116 | 3/2007 |
| JP | 2007 116116 | 5/2007 |
| JP | 2007 173408 | 7/2007 |
| JP | 2007 262154 | 10/2007 |
| JP | 2007 270004 | 10/2007 |
| JP | 2007 300043 | 11/2007 |
| JP | 2008 21905 | 1/2008 |
| WO | 2005 093860 | 10/2005 |
| WO | 2006 090834 | 8/2006 |

OTHER PUBLICATIONS

Office Action issued Dec. 11, 2012 in Japanese Patent Application No. 2012-228383.

* cited by examiner

US 8,471,283 B2

WHITE LED LAMP, BACKLIGHT, LIGHT EMITTING DEVICE, DISPLAY DEVICE AND ILLUMINATION DEVICE

TECHNICAL FIELD

The present invention relates to a technical lighting device comprising: a light emitting diode for emitting UV light (ultraviolet light) to purple light as a primary light from the light emitting diode; and a phosphor layer for receiving the UV light to purple light and emitting a white light; wherein the phosphor layer is composed of transparent resin and phosphor powder dispersed in the transparent resin, and the phosphor powder receives the UV light to purple light and emits a secondary light having a wavelength longer than that of the primary light. More particularly, the present invention relates to a white LED (light emitting diode) lamp, a backlight, a light emitting device, a display device and an illumination device using the white LED lamp.

BACKGROUND ART

A light emitting diode (LED) is a semiconductor diode for radiating light, and has a function of converting an electrical energy into ultraviolet light or visible light.

Conventionally, there has been widely utilized a light emitting device using an LED lamp. The LED lamp is manufactured, for example, in such a manner that a light emitting chip is formed by using a substrate such as a transparent substrate or the like and a light emitting material such as GaP, GaAsP, GaAlAs, GaN, InGaN, AlGaN, InGaAlP or the like, then the light emitting chip is sealed by a transparent resin.

When various phosphors are contained in a sealing resin, the LED lamp is able to adjust a color of the emitting light. That is, when a light emitting chip for emitting a light and a phosphor powder for absorbing the light and releasing a light having a predetermined range of wavelength are combinatory used, it becomes possible to emit a light or a white light having a visible wavelength range, by the actions of the light emitted from the light emitting chip and the light emitted from the phosphor powder.

As the white light emitting LED lamp for emitting the white light, a white light emitting LED lamp using a blue light emitting diode chip and a white light emitting LED lamp using a UV light or a violet light emitting diode chip are well known.

As the white light emitting LED lamp using a blue light emitting diode chip, there have been well known: an LED lamp in which a blue light emitting diode chip and a red light emitting phosphor (red phosphor) and a green light emitting phosphor (green phosphor) or the like are combined, (hereinafter referred to as "white LED lamp type 1"); and an LED lamp using a blue light emitting diode chip and an yellow light emitting phosphor (yellow phosphor) such as YAG or the like are combined, (hereinafter referred to as "white LED lamp type 2").

Furthermore, as the white light emitting LED lamp using a UV light or violet light emitting diode chip, there has been well known an LED lamp in which a UV light or violet light emitting diode chip and a red phosphor, a green phosphor and a blue phosphor or the like are combined, (hereinafter referred to as "white LED lamp type 3).

Because a color of the light emitted from the white LED lamp is white, the white LED lamp is used as a light source for a backlight of a liquid crystal display device and a light source of an illumination device or the like.

The white LED lamp used as the light source for the backlight of the liquid crystal display device is demanded to have various color qualities such that a color reproducing property is wide, the lamp can be designed to comprise a predetermined white chromaticity, a scattering of the chromaticity is small, and the like.

Further, the white LED lamp used as the light source for the illumination device is demanded to have various color qualities such that a color rendering property is excellent, the lamp can be designed to comprise a predetermined white chromaticity, a color unevenness is small, a scattering of the chromaticity is small, and the like.

Therefore, in a case where the white LED lamp is used as the light source for the backlight of the liquid crystal display device, the white LED lamps of type 1 and type 2 have raised the following problems.

Namely, the white LED lamp of type 1 has drawbacks such that the color unevenness is large, the scattering of the chromaticity is also large, and the like. On the other hand, the white LED lamp of type 2 have drawbacks such that the color reproducing property is narrow, the color rendering property is not good, and the lamp can not be designed to comprise a predetermined white chromaticity, and the like.

In contrast, according to the white LED lamp of type 3, it is possible to satisfy the various color qualities such that the color reproducing property is broad, the lamp can be designed to comprise a predetermined white chromaticity, the color rendering property is good, and the color unevenness is small, and the like. Therefore, the white LED lamp of type 3 is suitable as the light source for the backlight of the liquid crystal display device and the light source of the illumination device.

For example, Japanese Patent Application (Unexamined Publication) No. 2005-191420 (patent Document 1) discloses a white LED lamp of type 3. According to this white LED lamp, a luminous efficiency is increased to be high.

On the other hand, in recent years, conventional Brown-tube televisions as various display device have been replaced with thin-model television represented by a liquid crystal television or a plasma television. The above display device is disclosed in Japanese Patent Application (unexamined publication) No. 2000-49380 and Japanese Patent Application (unexamined publication) No. HEI 10-187062 (refer to Patent Documents 2 and 3). The advantages and the disadvantages of the above display devices are collectively shown in Table 3.

As is clear from the results shown in Table 3, the advantages and the disadvantages of the display devices vary in the respective technical points. However, a main reason, why demand and market are shifting from Brown-tube televisions to the thin-model televisions such as liquid crystal television, plasma television or the like, has been confirmed that the problem is a large depth, weight and size of the television rather than a problem of displayed image per se of the television. Accordingly, if the problem of the large size is solved while a favorable characteristic of Brown tube television is maintained as it is, it is said that an ideal display (display device) can be actually realized.

Patent Document 1: Japanese Patent Application (Laid-Open) No. 2005-191420.
Patent Document 2: Japanese Patent Application (Laid-Open) No. 2000-49380.
Patent Document 3: Japanese Patent Application (Laid-Open) No. HEI 10-187062

DISCLOSURE OF INVENTION

However, according to the conventional white LED lamp of Type 3, when a part of UV light emitted from the light emitting diode chip is not converted into a visible light and the non-converted UV light is released to outside the LED lamp, an affect of UV light and an affect of heat generated from the white LED lamp act to each other whereby there has been posed problems of causing the following phenomena.

Namely, in a case where the white LED lamp of Type 3 is used as a light source of backlight for a liquid display device, there arises problems such that resin-made peripheral members such as a light guide plate or optical film or the like of the crystal liquid display device are changed into yellow (yellow discoloration) whereby the luminance of the crystal liquid display device is disadvantageously lowered, and an abnormal chromaticity occurs.

Further, in a case where the white LED lamp of Type 3 is used as a light source of an illumination device, there arises problems such that the illuminated object is damaged and a discoloration would occurs. Therefore, the conventional white LED lamp of Type 3 cannot be used as a light source of the illumination device provided to a picture gallery and art museum.

The white LED lamp of the present invention has been achieved to solve the above conventional problems, and an object of the present invention is to provide a white LED lamp in which an amount of UV light to be contained in the released light and an amount of heat to be generated from the lamp are decreased to be small, and to provide a backlight and an illumination device using the white LED lamp.

The white LED lamp of the present invention capable of solving the above problems is configured by comprising:

a conductive portion;

a light emitting diode chip, which is mounted on the conductive portion, for emitting a primary light having a peak wavelength of 360 nm to 420 nm;

a transparent resin layer, which is composed of a first hardened transparent resin, for sealing the light emitting diode chip; and a phosphor layer for covering the transparent resin layer, the phosphor layer being formed by dispersing a phosphor powder into a second hardened transparent resin, and the phosphor powder receiving the primary light and radiating a secondary light having a wavelength longer than that of the primary light, wherein an energy of the primary light contained in the radiated secondary light is 0.4 mW/lm or less.

A backlight according to the present invention is capable of solving the above problems, and is characterized by using the above white LED lamp.

An illumination device according to the present invention is capable of solving the above problems, and is characterized by using the above white LED lamp.

In another aspect of the present invention, there is provided a light emitting device comprising: a laser diode for emitting a laser light having a peak wave length of 360 nm to 420 nm; and a phosphor layer for being excited by the laser light and emitting blue, green and red lights.

Further, a display device of the present invention is configured by comprising: a laser diode for emitting a laser light having a peak wave length of 360 nm to 420 nm; and a phosphor surface having a predetermined pattern which is formed by arranging phosphor layers in two dimensional directions, the phosphor layers emitting red, green or blue lights when excited by the laser light, wherein the laser light scans on the phosphor surface and an image is displayed by a light excited by the laser light.

Further, an illumination device of the present invention is configured by comprising: a laser diode for emitting a laser light having a peak wavelength of 360 nm to 420 nm; and a phosphor film which is formed by mixing a phosphor emitting blue light, a phosphor emitting green light and a phosphor emitting red light when the phosphors are excited by the laser light, wherein a visible light is obtained by radiating the laser light to the phosphor film.

According to the white LED lamp of this invention, an amount of the UV light contained in the radiated white light and an amount of heat generated from the lamp are small.

Further, according to the backlight of this invention, the amount of UV light contained in the released light and the amount of heat generated from the white LED lamp are small.

Furthermore, according to the illumination device of this invention, the amount of UV light contained in the released light and the amount of heat generated from the white LED lamp are small. Therefore, an amount of harmful ultra violet rays leaked from the white LED lamp is small, and a harmful effect against eyes and skin can be excluded. In addition, an amount of heat generated from the illumination device is small, so that the illumination device is excellent in energy efficiency and energy-saving performance (energy conservation property).

In particular, according to the display device using the laser diode for emitting a laser light having a peak wavelength of 360 nm to 420 nm is used as an excitation light source, an excited light having a narrow band peak wavelength, so that it is easy to scan the phosphor layer by using the excited light, whereby a high definition image can be obtained.

BEST MODE FOR CARRYING OUT THE INVENTION

The white LED lamp, the backlight, and the illumination device according to the present invention will be explained hereunder with reference to the accompanying drawings.

First Embodiment

Figure 1:
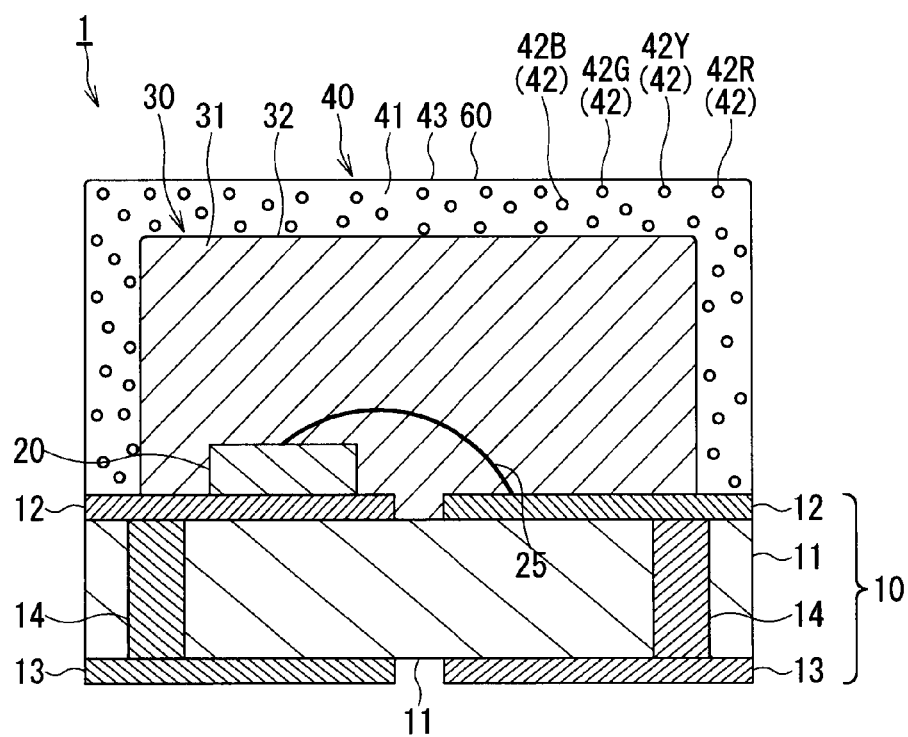
FIG. 1 is a cross sectional view schematically showing a structure of a first embodiment of a white LED lamp according to the present invention.

FIG. 1 is a cross sectional view schematically showing a first embodiment of a white LED lamp according to the present invention. As shown in FIG. 1, the white LED lamp 1 comprises: a substrate 10 provided with a front surface side electrode 12 as a conductive portion which is provided on an insulation portion 11; a light emitting diode chip mounted on the front surface side electrode 12 of the substrate 10; a transparent resin layer 30 for sealing the light emitting diode chip 20; and a phosphor layer 40 for covering the transparent resin layer 30.

(Substrate)

The substrate 10 comprises: the insulation portion 11; the front surface side electrode 12 provided to the front side of the substrate 10 and a rear surface side electrode 13 provided to a rear surface side of the substrate 10; and a power-supplying via 14 passing through the insulation potion 11 so as to establish an electrical connection between the front surface side electrode 12 and the rear surface side electrode 13.

(Insulation Portion)

As a material for constituting the insulation portion 11, for example, plate members composed of ceramics such as alumina, aluminum nitride (AlN) or glass epoxy resin or the like are used. When the insulation portion 11 is formed of alumina plate or aluminum nitride plate, a thermal conductivity is high, so that a temperature rise of the white LED lamp can be suppressed, thus being preferable.

Further, when the insulation portion 11 is composed of glass epoxy resin plate formed with a heat radiation via 14a which is formed by filling a silver paste, a copper paste or the like into a via hole passing through between: an entire portion or a part of a portion among the front surface side electrode 12 to which the light emitting diode chip 20 is provided; and rear surface side electrode 13, a thermal conductivity is high, so that the temperature rise of the white LED lamp can be suppressed, thus being also preferable.

An effect of suppressing the temperature rise in the white LED lamp can be confirmed, for example, by measuring a lowering of a thermal resistance (heat resistance) Rth between a junction portion of the LED chip and a rear surface of the insulation portion 11. In the present invention, the thermal resistance Rth is, for example, 40° C./W or less per one light emitting diode chip.

(Conductive Portion)

The conductive portion as the front surface side electrode 12 is provided onto the insulation portion 11 thereby to constitute the substrate 10. The front surface side electrode 12 is one conductive portion of a side onto which the light emitting diode chip is mounted, so that the front surface side electrode 12 is configured as a light-reflective electrode. This light-reflective electrode means an electrode having a reflectivity of 60% or more with respect to a light having a wavelength of 400 nm when the reflectivity is measured by a spectral reflectometer. As the light-reflective electrode, metal electrodes composed of Ag, Pt, Ru, Pd and Al or the like can be recommended.

When the front surface side electrode 12 is configured as the light-reflective electrode, even if a part of a secondary light emitted from the phosphor powder 42 is reflected to a side of the front surface side electrode 12 or even if a part of a primary light emitted from the light emitting diode chip 20 is reflected at an interface between the transparent resin layer 30 and the phosphor layer 40 thereby to be reflected to a side of the front surface side electrode 12, the reflected lights are further reflected at the front surface side electrode 12, thereby to be reflected to a side of a releasing surface 60. As a result, a luminance of the white LED lamp can be increased to be high.

The rear surface side electrode 13 is not required to have the light reflecting property unlike the front surface side electrode 12, so that the rear surface side electrode 13 can be formed of well known metal materials such as Ag, Pt, Ni, Cu, Au or the like.

When the substrate 10 is an alumina substrate using an alumina plate as the insulation portion 11, or an aluminum nitride substrate using an aluminum nitride plate as the insulation portion 11, or a glass epoxy substrate using an glass epoxy plate as the insulation portion 11 and provided with a heat radiating via, the substrate 10 has a high thermal conductivity, so that the temperature rise of the white LED lamp can be suppressed, thus being preferable.

(Light Emitting Diode Chip)

The light emitting diode chip (LED chip) 20 is a light emitting diode chip for emitting an UV light to violet light (primary light) having a peak wavelength of 360 nm to 420 nm. As the light emitting diode chip 20, for example, InGaN type, GaN type or AlGaN type light emitting diode chips can be exemplified. It is more preferable that the peak wavelength of the light emitted from the light emitting diode chip ranges from 360 nm to 410 nm.

The light emitting diode chip 20 is bonded to the substrate 10 through bonding agents of various solders such as Au—Sn eutectic solder or the like or silver paste or the like. Further, an electrode of the light emitting diode chip is electrically connected to a surface of the front surface side electrode 12 by means of a bonding wire 25.

(Transparent Resin Layer)

The transparent resin layer 30 seals the light emitting diode chip 20, and is composed of a first transparent resin hardened substance 31.

The light emitting diode chip 20 normally has a high reflection factor, and has a characteristic of blocking a light within the LED chip 20. Therefore, when a part of the primary light emitted from the light emitting diode chip is reflected at an interface between the transparent resin layer and the phosphor layer thereby to be reflected to the light emitting diode chip or when a visible light (secondary light) radiated from the phosphor powder 42 of the phosphor layer 40 is entered into the LED chip 20, these lights are stayed within the LED chip, so that the blocked lights are hardly brought out. As a result, there is posed a problem such that a luminance is disadvantageously lowered.

The transparent resin layer 30 has a function of preventing the secondary light emitted from the phosphor layer 40 from being entered into the LED chip 20 thereby to suppress to lower the luminance.

The first transparent resin hardened substance 31 is formed by hardening (setting) a resin having a high transparency. As a transparent resin, for example, silicone resins, epoxy resins or the like are recommended. Among the silicone resins, dimethyl silicone resin is particularly preferable due to its high UV resistance.

The transparent resin layer 30 can be obtained by such a manner that the transparent resin is poured on the light emitting diode chip 20 and the bonding wire 25, and then the poured resin is heated up to a temperature of 100 to 160° C. thereby to harden the transparent resin.

Figure 5:
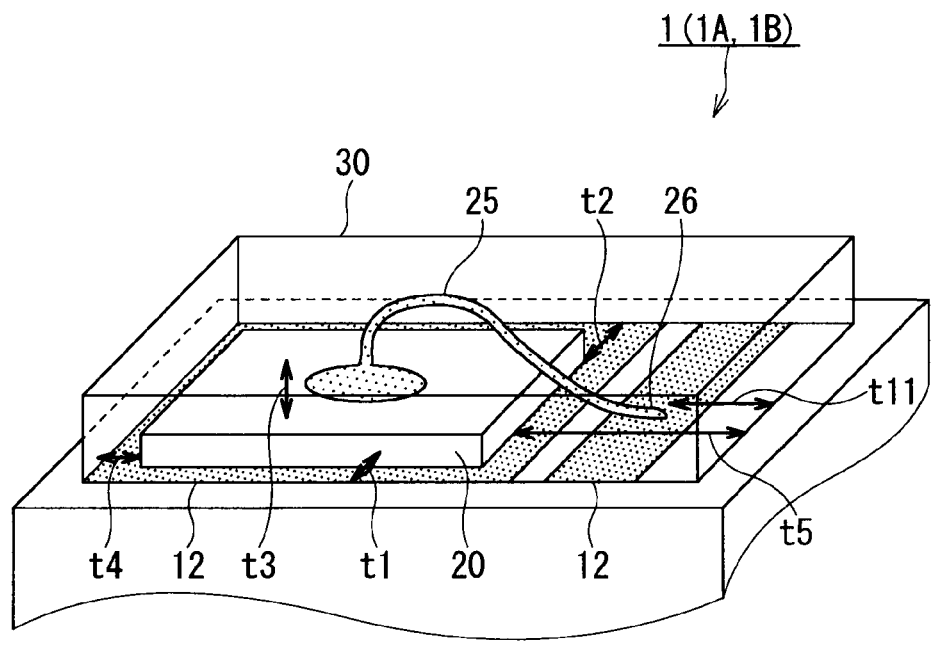
FIG. 5 is a perspective view schematically showing one example of thickness of a transparent resin layer.

In the present invention, a thickness of the transparent resin layer 30 means a distance between a surface of the light emitting diode chip 20 and an interface 32 of the phosphor layer 40. The thickness of the transparent resin layer 30 is indicated by reference symbols of t1 to t5 or the like as shown in FIG. 5.

The thickness of the transparent resin layer 30 is normally set to 0.1 mm or more, preferably to 0.2 mm or more, more preferably to within a range of 0.2 mm to 1.0 mm.

When the thickness of the transparent resin layer 30 is 0.1 mm or more, a luminous efficiency is preferably improved.

On the other hand, when the thickness of the transparent resin layer 30 is excessively large, a size of the white LED lamp becomes large, so that there may be a fear that the white LED lamp becomes unsuitable for a light source of backlight of a liquid crystal display device or a light source for an illumination device. Therefore, it is preferable to set the thickness of the transparent resin layer 30 to 1.0 mm or less so that the white LED lamp can be incorporated within a size range which is suitable for the light source of the backlight for the liquid crystal display device or the light source for the illumination device.

In the present invention, a wire landing site thickness is defined as a distance between a wire landing site 26 in the transparent resin layer 30 and an interface 32 of the phosphor layer 40. The wire landing site thickness is indicated by a reference symbol of t11 to t5 or the like as shown in FIG. 5.

The wire landing site thickness is preferably set to 0.5 mm or more from the viewpoint of protecting the bonding wire 25.

(Phosphor Layer)

The phosphor layer 40 covers the transparent resin layer 30, and the phosphor layer 40 is formed by dispersing the phosphor powder 42 into a second transparent resin hardened substance 41. The phosphor powder 42 receives the primary light emitted from the light emitting diode chip 20 and emits a light (secondary light) having a wavelength longer than that of the primary light.

The second transparent resin hardened substance 41 is formed by hardening (setting) a resin having a high transparency. As the transparent resin for forming the second transparent resin hardened substance 41, for example, the same resin as the transparent resin used for forming the first transparent resin hardened substance 31. The transparent resin used for forming the second transparent resin hardened substance 41 and the transparent resin used for forming the first transparent resin hardened substance 31 may be the same kind of resin, or may be different to each other.

As the phosphor powder 42 used in the phosphor layer 40, there are used a blue phosphor powder 42B (42) for receiving the primary light emitted from the light emitting diode chip 20 and emitting a blue color light, a green phosphor powder 42G (42) for emitting a green color light, a yellow phosphor powder 42Y (42) for emitting a yellow color light and a red phosphor powder 42R (42) for emitting a red color light, or the light.

(Blue Phosphor Powder)

As the blue phosphor powder 42B, a blue phosphor powder for emitting a blue color light having a peak wavelength of 430 nm to 460 nm is used.

As the blue phosphor powder 42B, for example, a blue phosphor powder having a composition expressed by the following equation (1) is used.

$$(Sr_{1-x-y-z}Ba_xCa_yEu_z)_5(PO_4)_3Cl \quad (1)$$

wherein x, y and z respectively satisfy the relations $0 \leq x < 0.5$, $0 \leq y < 0.1$, $0.005 < z < 0.1$.

When x and y in the equation (1) are respectively within the above ranges, the wavelength of a light emitted from the blue phosphor powder becomes suitable to the white LED lamp for an illumination use and a backlight use, thus being preferable.

As the x and y values prescribed in the equation (1) are increased within the above ranges, an amount of light component having a long wavelength is increased in the light emitted from the blue phosphor powder, so that the white LED lamp becomes more suitable for an illumination use.

In contrast, as the x and y values prescribed in the equation (1) are decreased within the above ranges, a spectrum width of the light emitted from the blue phosphor powder becomes narrow, so that the white LED lamp becomes more suitable for a backlight use.

When z in the equation (1) is within the above range, a luminous efficiency of the blue phosphor powder becomes to be high, thus being preferable.

(Green Phosphor Powder)

As the green phosphor powder 42G, a green phosphor powder for emitting a green color light having a peak wavelength of 490 nm to 575 nm is used. As the green phosphor powder 42G, for example, a green phosphor powder composed of europium/manganese-activated aluminate having a composition expressed by an equation (2) is used.

$$(Br_{1-x-y-z}Sr_xCa_yEu_z)(Mg_{1-u}Mn_u)Al_{10}O_{17} \quad (2)$$

wherein x, y, z and u respectively satisfy the relations $0 \leq x < 0.2$, $0 \leq y < 0.1$, $0.005 < z < 0.5$, $0.1 < u < 0.5$.

When z and u prescribed in the equation (2) are within the above ranges, a luminous efficiency of the green phosphor powder becomes to be high, thus being preferable.

When z and u prescribed in the equation (2) are within the above ranges, a life and a brightness (luminance) of the green phosphor powder are well-balanced, thus being preferable.

When x prescribed in the equation (2) exceeds 0.2, there may be a fear of lowering the life of the green phosphor powder. Further, when x prescribed in the equation (2) is equal to zero, a short wavelength component is increased in the light emitted from the green phosphor powder, so that there may be a fear of lowering the brightness.

(Yellow Phosphor Powder)

As the yellow phosphor powder 42Y, a yellow phosphor powder for emitting a yellow color light having a peak wavelength of 545 nm to 565 nm is used. As the yellow phosphor powder 42Y, for example, at least one of yellow phosphor powders having compositions expressed by equation (3) and equation (4) are used.

$$ZnS:Au_cAl_d \quad (3)$$

wherein c and d respectively satisfy the relations $0.0001 < c$, $d < 0.002$.

When c and d prescribed in the equation (2) are within the above ranges, a luminous efficiency of the yellow phosphor powder becomes to be high, thus being preferable.

$$(Sr_{2-x-y-z-u}Ba_xMg_yEu_zMn_u)SiO_4 \quad (4)$$

wherein x, y, z and u respectively satisfy the relations $0.1 < x < 0.4$, $0.005 < y < 0.21$, $0.05 < z < 0.3$, $0.001 < u < 0.04$.

When x in the equation (4) is within the above range, the wavelength of a light emitted from the yellow phosphor powder becomes suitable to the illumination use and the backlight use, thus being preferable. Further, as the x value prescribed in the equation (4) is increased within the above range, the wavelength of the light emitted from the yellow phosphor powder becomes to be short, so that the white LED lamp becomes more suitable for the backlight use.

When y prescribed in the equation (4) is within the above range, a solid solution of Mn is sufficiently advanced, thus being preferable.

When z prescribed in the equation (4) is within the above range, the luminous efficiency of the yellow phosphor powder becomes to be high, thus being also preferable.

When u in the equation (4) is within the above range, the wavelength of the light emitted from the yellow phosphor powder becomes suitable to the illumination use and the backlight use, thus being preferable. Further, as the u value prescribed in the equation (4) is increased within the above range, the wavelength of the light emitted from the yellow phosphor powder becomes to be long, so that the white LED lamp becomes more suitable for the illumination use.

(Red Phosphor Powder)

As the red phosphor powder 42R, a red phosphor powder for emitting a red color light having a peak wavelength of 620 nm to 780 nm is used. As the red phosphor powder 42R, for example, at least one of a red phosphor powder composed of europium activated lanthanum oxysulfide having a composition expressed by equation (5) and a red phosphor powder having a composition expressed by equation (6) are used.

$$(La_{1-x-y}Eu_xM_y)_2O_2S \quad (5)$$

wherein M is at least one element selected from a group consisting of Sb, Sm, Ga and Sn, while x and y respectively satisfy the relations $0.01<x<0.15$, $0 \leqq y<0.03$.

When M prescribed in the equation (5) is at least one element selected from the group consisting of Sb, Sm, Ga and Sn, the luminous efficiency of the red phosphor powder becomes to be high, thus being also preferable.

$$(Sr_xCa_{1-x})SiAlN_3:Eu \quad (6)$$

wherein x satisfies a relation $0 \leqq x<0.4$.

When x in the equation (6) is within the above range, a range of wavelength of a light emitted from the red phosphor powder becomes suitable, the luminous efficiency is high, and the wavelength range and the luminous efficiency are well balanced, thus being preferable. Further, as the x value prescribed in the equation (6) is increased within the above range, the wavelength of the light emitted from the red phosphor powder is liable to be short. In contrast, as the x value is decreased to be small within the above range, the luminous efficiency of the red phosphor powder is liable to be high.

An average grain size of the respective phosphor powders 42 (42B, 42G, 42Y and 42R) is normally set to 10 μm or more, preferably to 10 to 100 μm, more preferably to 20 to 80 μm. In this connection, the average grain size means a grain size of $D_{50}$ indicating a weight-integrated value at 50%.

When the average grain size of the respective phosphor powders 42 are 10 μm or more, a light extracting efficiency of the white LED lamp is increased to be high, thus being preferable.

When the average grain size of the phosphor powder 42 is excessively large, phosphor grains are liable to settle down in the phosphor slurry and the slurry becomes non-uniform, so that there may be a fear of causing a large scattering in optical characteristics. In contrast, when the average grain size of the phosphor powder 42 is less than 10 μm, there may be a fear of lowering a light extracting efficiency.

each of the phosphor powders 42 can be obtained through well-known manufacturing method in which a blending ratio of material powders are controlled, calcinating conditions such as temperature and time are controlled, and resultant calcined body is pulverized or classified.

The phosphor powders 42 is normally prepared by combining three or four kinds of phosphor powders selected from a blue phosphor powder 42B, a green phosphor powder 42G, a yellow phosphor powder 42Y, and a red phosphor powder 42R. The phosphor powders 42 are dispersed into a phosphor layer 40. Further, in a case where three kinds of the phosphor powders 42 for emitting the respective color lights are used in combination, normally, at least the blue phosphor powder 42B and the red phosphor powder 42R are used to be included.

FIG. 1 schematically shows a state where the respective phosphor powders 42 (42B, 42G, 42Y and 42R) for emitting the respective color lights are mixed and dispersed into the phosphor layer 40.

For example, the phosphor layer 40 is obtained through a method comprising the steps of: mixing a transparent resin and the respective phosphor powders thereby to prepare respective phosphor slurries in which the respective phosphor powders are dispersed into the transparent resin; mixing the respective phosphor slurries thereby to prepare a mixed phosphor slurry; coating the mixed phosphor slurry to a transparent resin layer 30; and hardening (curing) the coated slurry. At a time of preparing the mixed phosphor slurry, the blending ratio of the respective phosphor powders for emitting the respective color lights is adjusted so as to obtain an aimed emitting light color of the secondary light.

The mixed phosphor slurry normally has a slurry concentration of 40 wt % to 80 wt %, preferably, 50 wt % to 80 wt %. When the slurry concentration is within the above range, a luminance becomes high and it is easy to coat the slurry onto the transparent resin layer 30, thus being preferable.

When the slurry concentration is less than 40 wt %, there may be a fear that the primary light transmitting the phosphor layer is increased. While, when the slurry concentration exceeds 80 wt %, there may be a fear that it becomes difficult to coat the mixed phosphor slurry onto the transparent resin layer 30.

The mixed phosphor slurry can be hardened (cured) by heating the slurry to a temperature range of 100° C. to 160° C.

Figure 6:
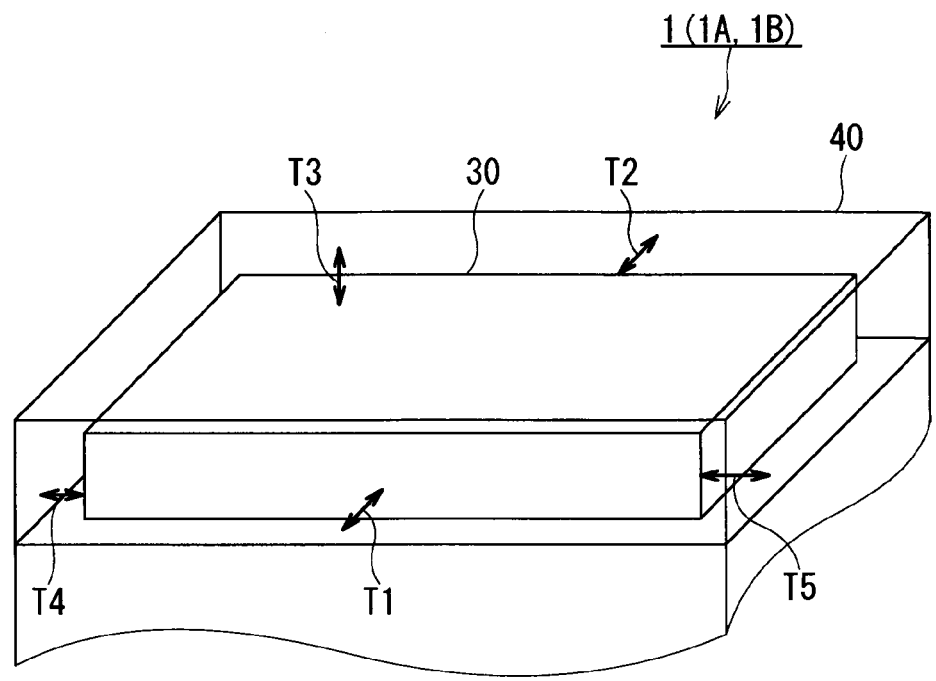
FIG. 6 is a perspective view schematically showing one example of thickness of a phosphor layer.

In the present invention, a thickness of the phosphor layer 40 means a distance between an interface 32 of the transparent resin layer 30 and a front surface 43 of the phosphor layer 40. The thickness of the phosphor layer 40 is indicated by reference symbols of T1, T2, T3, T4, T5 or the like as shown in FIG. 6.

The thickness of the phosphor layer 40 is normally set to 0.1 mm or more, preferably to 0.1 to 1.5 mm, more preferably to within a range of 0.1 mm to 0.8 mm.

When the thickness of the phosphor layer 40 is 0.1 mm or more, it is possible to suppress a releasing of UV light emitted from the light emitting diode 20 to outside the white LED lamp 1, and the secondary light can be effectively extracted, thus being also preferably.

When the thickness of the phosphor layer 40 is less than 0.1 mm, there may be a fear that the releasing of the UV light emitted from the light emitting diode 20 to outside the white LED lamp 1 cannot be suppressed. While, when the thickness of the phosphor layer 40 is excessively large, there may be a fear that the extracting efficiency of the secondary light is lowered.

[Function]

Next, a function of the white LED lamp 1 will be explained.

when the light emitting diode chip 20 is energized by being bapplied with a power current, then it emits a UV light or a violet light (primary light). This primary light transmits through the transparent resin layer 30 and reaches to the phosphor layer 40, whereby the phosphor powders 42 contained in the phosphor layer 40 emit a blue color light, a green color light, a yellow color light and a red color light or the like. A content ratio of each of the respective phosphor powders for emitting the respective color lights is determined so that a color of a totalized secondary light becomes white color. Therefore, a white light emitted from an output surface 60 of the white LED lamp 1 satisfies relations of $0.19 \leq x$, $y \leq 0.38$ in terms of chromaticity values (x, y) prescribed in XYZ color system.

A part of the primary light (UV light or violet light) emitted from the light emitting diode chip 20 transmits through the second transparent resin hardened substance 41 of the phosphor layer 40, and then outputted from the white LED lamp 1.

In the white LED lamp 1, an energy amount of the primary light contained in the outputted light is normally suppressed to be 0.4 mW/lm or less.

The present invention specified as a technical index that a primary light energy per one light flux is 0.4 mW/lm or less. This technical index can be obtained in accordance with the following procedures by using a spectrum $F(\lambda)$ obtained by various measuring devices such as a total luminous flux measuring device, a momentary multi-photometry system (MCPD) and other measuring devices.

On the basis of an equation (7) hereunder, the spectrum $F(\lambda)$ and a relative visibility $V(\phi)$ are multiplied together, and then integrated thereby to obtain $\phi$. In this connection, the relative visibility $V(\phi)$ is defined as a visibility which is relatively calculated from a standard visibility of 1 with respect to a light having a wavelength of 555 nm.

$$\phi = 683 \cdot \int F(\lambda) \cdot V(\lambda) d\lambda \quad (7)$$

On the basis of an equation (8) hereunder, the primary light energy is obtained by integrating the spectrum $F(\lambda)$ at a range of 360 to 410 nm, thereby to calculate UV.

$$UV = \int_{360}^{410} F(\lambda) d\lambda \quad (8)$$

The primary light energy per light flux can be obtained from a calculation formula: $UV/\phi$.

In the above procedure, even if a unit of $F(\lambda)$ is W/nm, $W/(sr \cdot m^2 \cdot nm)$ or no-unit (relative value), the primary light energy per light flux can be obtained In a case where a blue light is contained in the white light outputted from the white LED lamp 1, a ratio (peak intensity of the primary light/peak intensity of the blue color light) of the peak intensity of the primary light with respect to the peak intensity of the blue color light in an emission spectrum is 0.5 or less when an intensity of the primary light is assumed to be 1 as a reference mark. As a result, a residual amount of the primary light contained in the outputted light is small.

In this regard, in a case where a UV absorbing powder is further dispersed into the phosphor layer 40, the primary light emitted from the light emitting diode chip 20 is absorbed by the UV absorbing powder dispersed in the phosphor layer 40, so that it becomes more difficult for the primary light to be outputted from the output surface 60 of the white LED lamp 1.

Further, the white LED lamp 1 exhibits a high luminous efficiency of 20 lm/W or more.

Furthermore, when the light reflecting property of the front side electrode 12 is low, a part of the secondary lights emitted from the phosphor powders 42 is reflected to a side of the front side electrode 12, and a part of the primary lights emitted from the light emitting diode chip 20 is reflected at the interface between the transparent resin layer 30 and the phosphor layer 40 thereby to be reflected to the side of the front side electrode 12, so that a luminance (brightness) of the white LED lamp is lowered. However, the front surface side electrode 12 of the white LED lamp is configured by a light reflective electrode, so that the reflected light toward the front surface side electrode 12 is reflected to a side of the output surface 60, thus resulting in a high luminance.

According to the above white LED lamp 1, the amount of UV light contained in the outputted white light is small, so that there is hardly occurred a discoloration of an object illuminated by the light outputted from the above white LED lamp 1.

According to the above white LED lamp 1, the luminous efficiency is high, so that a power consumption required for obtaining a predetermined luminance and illumination intensity is not required so much, and heat generation is also small.

By the way, the present invention can adopt another structure in which a lead frame (not shown) is used in place of the substrate 10, and the white LED lamp is mount on a conductive portion of the lead frame. As the lead frame, lead frames composed of various metal materials such as Cu-type material including Cu—Fe—P alloy, Fe-type material including Fe-42% Ni alloy or the like, are used. Since the lead frame generally has a high thermal conductivity, a temperature rise of the white LED lamp mounted on the lead frame can be suppressed.

Due to above structure, a thermal resistance (heat resistance) Rth between: a junction portion of the LED chip which is connected to the conductive portion of the lead frame; and a rear surface of the lead frame can be lowered. In this structure, the thermal resistance Rth is, for example, 40° C./W or less per one light emitting diode chip.

Second Embodiment

Figure 2:
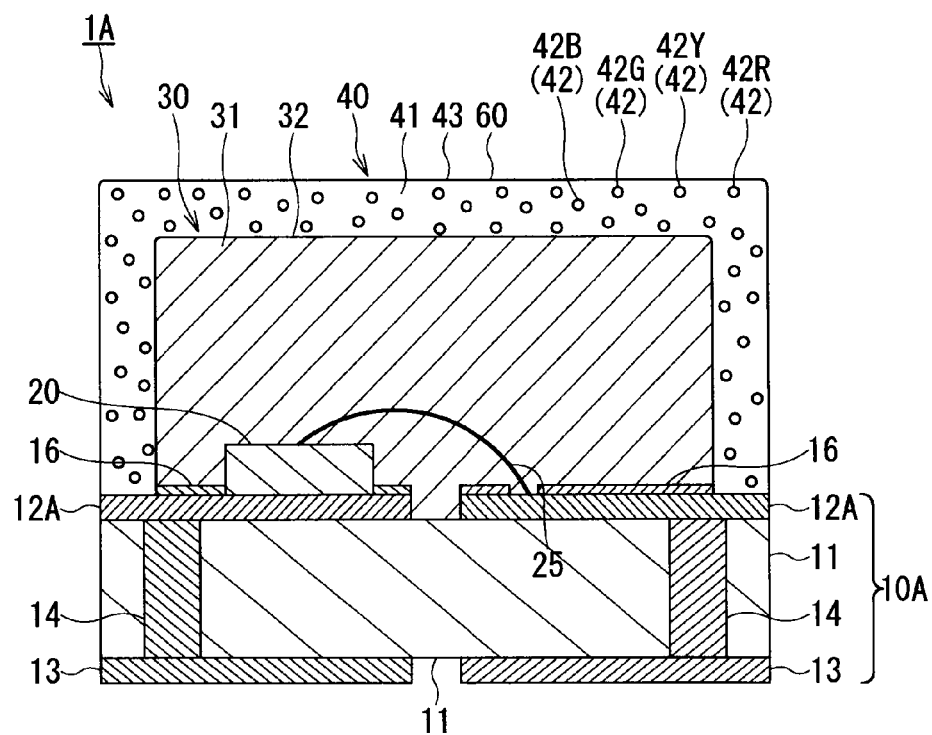
FIG. 2 is a cross sectional view schematically showing a structure of a second embodiment of the white LED lamp according to the present invention.

FIG. 2 is a cross sectional view schematically showing a structure of a second embodiment of the white LED lamp according to the present invention. The white LED lamp 1A of the second embodiment shown in FIG. 2 is configured by using a substrate 10A in place of the substrate 10 used in the white LED lamp 1 of the first embodiment shown in FIG. 1. Other elements of the white LED lamp 1A according to the second embodiments shown in FIG. 2 are the same as those of the white LED lamp 1 according to the first embodiments shown in FIG. 1. Therefore, the same reference numerals are used to denote the same members or elements as those of the first embodiment, and the detailed explanations of these members or elements are simplified or omitted hereunder.

In this second embodiment, the substrate 10A is used in place of the substrate 10, the front surface side electrode 12A is used in place of the front surface side electrode 12, and a light reflecting layer 16 is further formed to the front surface side electrode 12A.

The front surface side electrode 12A is composed of metal materials such as Ag, Pt, Ni, Cu, Au or the like. The front surface side electrode 12A is formed with the light reflecting layer 16 on the surface thereof, so that the front surface side electrode 12A needs not to be a light reflective electrode.

As the light reflecting layer 16, for example, a coated layer (cover layer) containing fine powder or a coated layer composed of metal is used.

As the coated layer containing fine powder, a coated layer containing fine inorganic powder composed of at least one of titanium oxide, barium sulfate, alumina and silica is used. In this regard, the fine powder means a powder having an average grain size of 10 μm or less.

The coated layer containing the fine powder is obtained, for example, by a method comprising the steps of: preparing an inorganic binder such as phosphate type binder, alkali metal silicate or an organic binder such as silicone resin or the like; and adhering the fine powder onto a surface of the front surface side electrode 12A using the above binders. The coated layer may also be obtained by another method comprising the steps of: sintering the fine powder thereby to form a sintered body; and fixing the sintered body onto the surface of the front surface side electrode 12A.

As the coated layer composed of metal, a coated layer composed of at least one metal materials selected from Al, Ag, Pt, Ru and Pd is used. The coated layer composed of metal is formed by plating these metals onto the surface of the front surface side electrode 12A.

[Function]

Next, a function of the white LED lamp 1A will be explained.

The white LED lamp 1A is different from the white LED lamp 1 in only a structural point where the front surface side electrode 12A and the light reflecting layer 16 are used in place of the front surface side electrode 12. Therefore, an explanation for a common function will be omitted or simplified.

As the same manner as in the white LED lamp 1, the white LED lamp 1A outputs a white light from an output surface 60.

In the white LED lamp 1A, a part of the second light emitted from the phosphor powder 42 is radiated to the light reflecting layer 16, and a part of the primary light emitted from the light emitting diode chip 20 and reflected at an interface between the transparent resin layer 30 and the phosphor powder 42 is radiated to the light reflecting layer 16. However, these reflected lights are reflected to a side of the output surface 60. Therefore, the white LED lamp 1A can exhibit a high luminance as the same manner as in the white LED lamp 1

Further, as the same manner as in the white LED lamp 1, chromaticity of the white light outputted from the output surface 60 of the white LED lamp 1A is within a range of $0.19 \leq x$, $y \leq 0.38$ in terms of chromaticity values (x, y) prescribed in XYZ color system.

In the white LED lamp 1A, as the same manner as in the white LED lamp 1, an energy amount of the primary light contained in the outputted light is normally suppressed to be 0.4 mW/lm or less.

In case of the white LED lamp 1A where a blue light is contained in the outputted white light because a blue phosphor powder is contained in the phosphor layer, as the same manner as in the white LED lamp 1, a ratio (peak intensity of the primary light/peak intensity of the blue color light) of the peak intensity of the primary light with respect to the peak intensity of the blue color light is 0.5 or less, and the white LED lamp 1A exhibits a high luminous efficiency of 20 lm/W or more.

According to the above white LED lamp 1A, the amount of UV light contained in the outputted white light is small, so that there is hardly occurred a discoloration of an object illuminated by the light outputted from the above white LED lamp 1A.

According to the above white LED lamp 1A, the luminous efficiency is high, so that a power consumption required for obtaining a predetermined luminance and illumination intensity is not required so much, and heat generation is also small.

In also the case of the above white LED lamp 1A, as the same as in the above white LED lamp 1, the lead frame (not shown) is used in place of the substrate 10A, so that it is possible to suppress the temperature rise of the white LED lamp mounted on the lead frame.

Due to above structure, a thermal resistance (heat resistance) Rth between: a junction portion of the LED chip which is connected to the conductive portion of the lead frame; and a rear surface of the lead frame can be lowered. In this structure, the thermal resistance Rth is, for example, 40° C./W or less per one light emitting diode chip.

Third Embodiment

Figure 3:
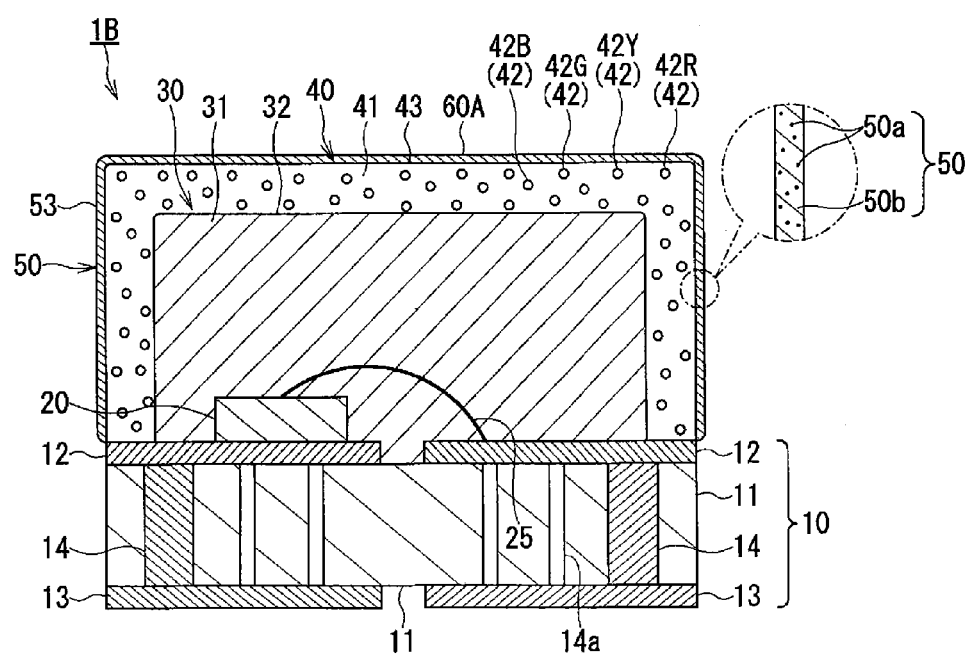
FIG. 3 is a cross sectional view schematically showing a structure of a third embodiment of the white LED lamp according to the present invention.

FIG. 3 is a cross sectional view schematically showing a structure of a third embodiment of the white LED lamp according to the present invention. With respect to the white LED lamp 1 of the first embodiment, the white LED lamp 1B of the third embodiment shown in FIG. 3 is configured to further form a UV absorbing layer 50 onto the surface of the phosphor layer 40.

Other elements of the white LED lamp 1B according to the third embodiments shown in FIG. 3 are the same as those of the white LED lamp 1 of the first embodiments shown in FIG. 1. Therefore, the same reference numerals are used to denote the same members or elements as those of the first embodiment, and the detailed explanations of these members or elements are simplified or omitted hereunder.

The UV light absorbing layer 50 is formed by dispersing UV light absorbing powder 50a into a third transparent resin hardened substance 50b.

The third transparent resin hardened substance is a product prepared by hardening a transparent resin having a high transparency. As the transparent resin for forming the third transparent resin hardened substance, for example, the transparent resin as the same one as used for forming the second transparent resin hardened substance 41 is used. The transparent resin for forming the third transparent resin hardened substance and the transparent resin for forming the second transparent resin hardened substance 41 may be the same to each other, or may be different to each other. However, when both the transparent resins are the same, a bonding property between the phosphor layer 40 and the UV absorbing layer 50 is high, thus being preferable.

The UV light absorbing powder means a powder selectively absorbing UV light. As the UV light absorbing powder, for example, there can be used a fine inorganic powder composed of at least one of titanium oxide, zinc oxide and cerium oxide. In this regard, the fine powder means a powder having an average grain size of 0.1 μm or less.

The UV light absorbing layer 50 can be obtained by a method comprising the steps of: preparing a UV absorbing powder slurry by mixing a transparent resin with the UV light absorbing powder; coating the UV absorbing powder slurry onto a surface of the phosphor layer 40; and hardening the coated UV absorbing powder slurry.

The UV absorbing powder slurry has a slurry concentration of 0.2 wt % to 50 wt %, preferably, 1 wt % to 10 wt %. When the slurry concentration of the UV absorbing powder slurry is within the range of 0.2 wt % to 50 wt %, the UV light absorbing layer 50 can suppress an outgoing of the UV light emitted from the light emitting diode 20 to outside the white LED lamp 1B, thus being preferable.

When the UV light absorbing layer 50 is formed, the primary light emitted from the light emitting diode 20 is absorbed by the UV light absorbing powder contained in the UV light absorbing layer 50, so that it becomes difficult for the primary light to be outputted from the output surface 60A of the white LED lamp 1B.

The UV absorbing layer 50 normally has a thickness ranging from 1 μm to 200 μm, preferably within a range of 10 μm to 100 μm. When the thickness of the UV absorbing layer 50 is within the range of 1 μm to 200 μm, it becomes difficult for the UV light emitted from the light emitting diode 20 to be outputted from the output surface 60A of the white LED lamp 1B, and a lowering of the luminance is small, thus being also preferable.

In this regard, the thickness of the UV absorbing layer 50 means a distance between an interface 43 of the phosphor layer 40 and a surface of the UV absorbing layer 50.

[Function]

Next, a function of the white LED lamp 1B will be explained.

The white LED lamp 1B is different from the white LED lamp 1 in only a structural point where the UV light absorbing layer 50 is further formed onto a surface of the phosphor layer 40. Therefore, an explanation for a common function will be omitted or simplified.

As the same manner as in the white LED lamp 1, the white LED lamp 1B outputs a white light from an output surface 60A.

In the white LED lamp 1B, since the UV light absorbing layer 50 is further formed onto a surface of the phosphor layer 40, even if a part of the primary light emitted from the light emitting diode chip 20 transmits through the phosphor layer 40, the transmitted primary light is absorbed by the UV light absorbing powder layer contained in the UV light absorbing layer 50.

Therefore, it becomes more difficult for the primary light to be outputted from the output surface 60A of the white LED lamp 1B in comparison with the white LED lamp 1.

Further, as the same manner as in the white LED lamp 1, chromaticity of the white light outputted from the output surface 60A of the white LED lamp 1B is within a range of $0.19 \leq x$, $y \leq 0.38$ in terms of chromaticity values (x, y) prescribed in XYZ color system.

In the white LED lamp 1B, as the same manner as in the white LED lamp 1, an energy amount of the primary light contained in the outputted light is normally suppressed to be 0.4 mW/lm or less.

In case of the white LED lamp 1B where a blue light is contained in the outputted white light because a blue phosphor powder is contained in the phosphor layer, as the same manner as in the white LED lamp 1, a ratio (peak intensity of the primary light/peak intensity of the blue color light) of the peak intensity of the primary light with respect to the peak intensity of the blue color light is 0.5 or less, and the white LED lamp 1A exhibits a high luminous efficiency of 20 lm/W or more.

According to the above white LED lamp 1B, the amount of UV light contained in the outputted white light is small, so that there is hardly occurred a discoloration of an object illuminated by the light outputted from the above white LED lamp 1A.

According to the above white LED lamp 1B, the luminous efficiency is high, so that a power consumption required for obtaining a predetermined luminance and illumination intensity is not required so much, and heat generation is also small.

In also the case of the above white LED lamp 1B, as the same as in the above white LED lamp 1, the lead frame (not shown) is used in place of the substrate 10, so that it is possible to suppress the temperature rise of the white LED lamp mounted on the lead frame.

Due to above structure, a thermal resistance (heat resistance) Rth between: a junction portion of the LED chip which is connected to the conductive portion of the lead frame; and a rear surface of the lead frame can be lowered. In this structure, the thermal resistance Rth is, for example, 40° C./W or less per one light emitting diode chip.

A backlight of the present invention has a structure in which the above white LED lamp is used as a light source of a liquid crystal display device.

The backlight of the present invention may be configured to comprise: for example, a light source unit assembled by linearly arranging a plurality of the white LED lamps in a lateral direction; and a light guide plate for receiving near stripe-shaped lights radiated from the light source unit and for outputting the lights such that the light guide plate receives the lights from a side surface thereof and outputs the lights from a front surface thereof.

According to the backlight of the present invention, the above white LED lamps are used as a light source, the white LED lamps hardly output UV light, and a heat radiation is also small. Therefore, even if the white LED lamps are used as the light source for the liquid crystal display device, a yellow-discoloration would not occur to the light guide plate or a luminance-improving film, so that a lowering of luminance of the liquid crystal display device or an abnormal chromaticity is hardly occurred.

An illumination device of the present invention has a structure in which the above white LED lamp is used as a light source.

The illumination device of the present invention can be configured to have a structure in which a plurality of the above white LED lamps are arranged in a form of linear pattern, grid-pattern or radial pattern, or the plurality of the white LED lamps are arranged in a form of combining these patterns.

According to the illumination device of the present invention, the above white LED lamps are used as a light source, the white LED lamps hardly output UV light, and a heat radiation is also small. Therefore, an object illuminated by the white LED lamps would not be damaged, and the yellow-discoloration would not occur to the object. As a result, the illumination device of the present invention is effective in a case where the object to be illuminated is an article on exhibition of a picture gallery or an art museum. Namely, the illumination device of the present invention is suitable as a light source for the picture gallery and the art museum.

Further, a light emitting device of the present invention is configured by comprising: a laser diode for emitting a laser light having a peak wave length of 360 nm to 420 nm; and a phosphor layer for being excited by the laser light and emitting blue, green and red lights. A basic structure of the light emitting device of the present invention is the same as that of the white LED lamp, and the light emitting device is configured by combining a plurality of aforementioned white LED lamps.

Furthermore, a display device of the present invention is configured by comprising: a laser diode for emitting a laser light having a peak wave length of 360 nm to 420 nm; and a phosphor screen having a predetermined pattern which is formed by arranging phosphor layers in two dimensional directions, the phosphor layers emitting red, green or blue lights when excited by the laser light, wherein the laser light scans on the phosphor screen and an image is displayed by a light excited by the laser light.

Figure 7:
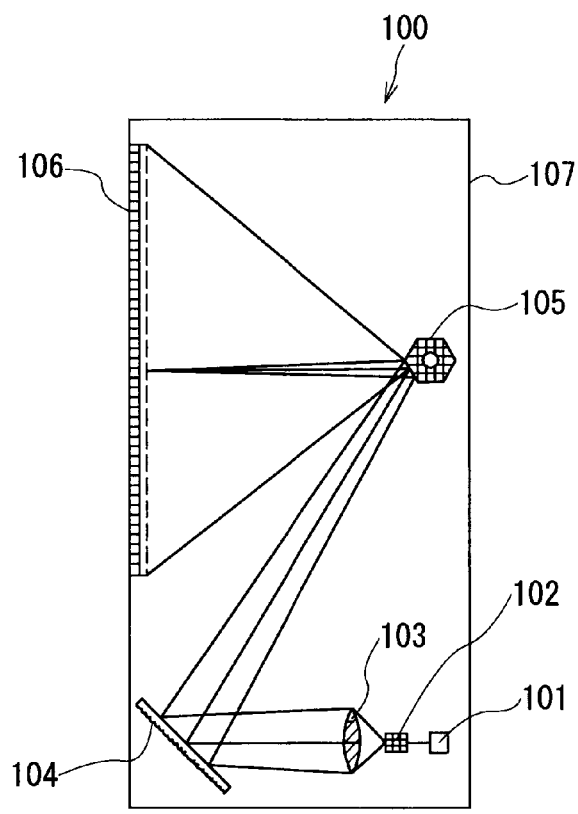
FIG. 7 is a cross sectional view schematically showing one embodiment of a display device according to the present invention.

The display device of the present invention is configured, for example, as shown in FIG. 7. Namely, the display device is configured to comprise: a light source 101 composed of a one-dimensional display element 102 for receiving a light outputted from the light source 101 and for outputting an image light; a fixed reflection mirror 104 for reflecting the image light outputted from the one-dimensional display element 102 through a projection lens 103; a movable reflection mirror (polygon mirror) 105 for further reflecting the image light reflected by the fixed reflection mirror 104; and a screen 106 for displaying the image light reflected by the movable reflection mirror (polygon mirror) 105 and for displaying the image light as two-dimensional image.

Figure 8:
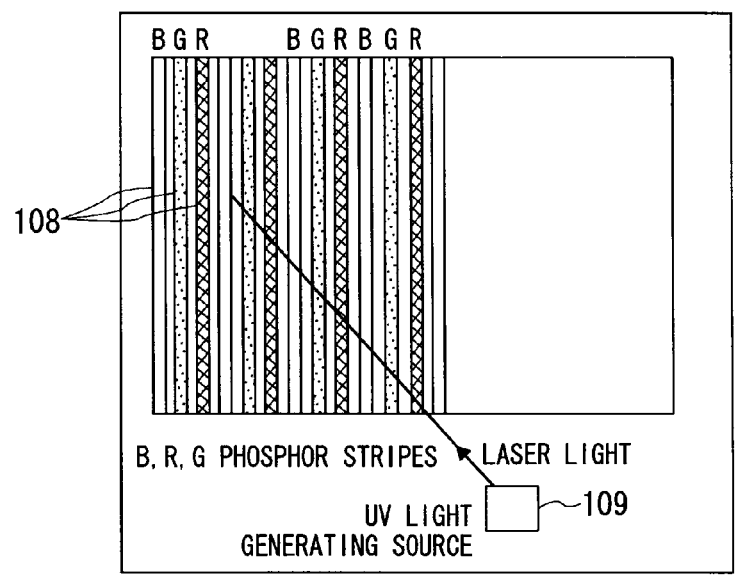
FIG. 8 is a sectional view schematically showing an example of structure of a phosphor layer formed in the display device according to the present invention.

Above constitutional elements are arranged in a thin casing (crystal liquid projector) having a thickness of about 100 mm. As shown in FIG. 8, the above screen 106 is formed with phosphor layers 108 for respectively emitting three colors of BGR lights, and the phosphor layers 108 formed on a glass substrate are compartmentalized to each other by black stripes.

The display device of the present invention is configured to comprise: a phosphor screen formed in a predetermined pattern and formed with the phosphor layers for respectively emitting blue (B), green (G), red (R) lights; and a ultraviolet laser light generating source 109 for generating a near-ultraviolet UV laser light having a wavelength of 365 nm to 420 nm so as to excite the phosphor layers and output the BGR lights. FIG. 8 shows a principle of this display device 100. At first, the laser light generated from the ultraviolet laser light generating source 109 excites the BGR phosphors formed in stripe-shapes thereby to emit BGR lights. The emitted lights transmit through a glass-like transparent plate formed with BGR phosphor stripes, and the transmitted lights are recognized as image at a side oppose to a side of the UV light generating source 109. In principle, the display device has a system similar to that of a Braun tube.

As the UV light generating source, for example, there can be used a solid-state laser (LD) using compound semiconductors such as gallium nitride, as gallium-indium nitride, as gallium-aluminum nitride, which have been remarkably advanced in recent years.

As the same as electron beam in Braun tube, a laser beam (laser light) is scanned on the phosphor stripes from right to left or up and down thereby to form the image. As the beam scanning method, there can be adopted: a method in which a moving direction of a pedestal to which the laser diode is fixed is electrically or magnetically controlled; or a method in which an emitting direction of the laser beam emitted from the laser diode is controlled by a mirror such as the polygon mirror.

As the laser light scanning method, there can be adopted: a method in which BGR phosphor stripes are scanned by one laser beam as shown in FIG. 8; or a method in which each of the BGR phosphor stripes is scanned and excited by one laser beam.

At the time of exciting the BGR phosphor stripes by the laser beam, there may be a case where an exciting portion of the respective phosphor stripes is slightly deviated in accordance with portions of the phosphor screen, or one stripe runs over the laser beam in accordance with a diameter size of the laser beam. In case of occurring this situation, the phosphor stripe other than the phosphor stripes for emitting aimed colors is excited, so that a grade (quality level) of the image is lowered. This defect can be improved by forming a blackish non-light emitting stripe to a portion between the adjacent BGR phosphor stripes, Further, the deviation of a spot to which the laser beam is radiated and an influence of the run-over of the laser beam diameter can be decreased, thereby to greatly improve a contrast property the image.

Further, in order to prevent the lowering the image quality, there can be also adopted a countermeasure such that a black-colored plate (black colored non-light emitting layer) formed with perforations in a striped pattern, dotted pattern, or grid pattern is disposed to a portion close to the phosphor screen. The effect of this black-colored plate is that when the deviation of the spot to which the laser beam is radiated and the run-over of the laser beam diameter are occurred, unnecessary portion of the laser beam diameter is cut by the black-colored plate and the laser beam is radiated to only a portion of the phosphor stripe for emitting aimed color light. The black colored non-light emitting layer) to be formed at a portion between the respective colors of the phosphor stripes can be formed by using a black substance such as, for example, carbon black.

Further, the black-colored plate disposed to the portion close to the phosphor screen can be formed by working, for example, a carbon plate, or a resin sheet, and a carbon fiber into which a carbon black pigment is mixed is used. The black-colored plate is preferably to be thin. However, the black-colored plate may be also worked such that a thickness of only a portion close to the perforation (hole) through which the laser beam passes is worked to be thin.

As the phosphor, it is preferable to use a phosphor which is well-excited by the laser beam having a wavelength of 365 nm to 420 nm. Concretely, it is preferable to use phosphors having the following composition ranges.

That is, as the blue phosphor (blue light emitting phosphor), it is preferable to use a phosphor for emitting the blue light having at least one composition expressed by following general formulas:

$$(Sr_{1-x-y-z}Ba_xCa_yEu_z)_5(PO_4)_3Cl$$

wherein x, y and z respectively satisfy the relations x, y<0.3 and 0.001<z<0.2;

$$(Ba_{1-x}Eu_x)MgAl_{10}O_{17}$$

wherein x satisfies the relation 0.01<x<0.3; and $$(Ba_{3-x-y}Sr_xEu_y)Mg_zSi_2O_8$$

wherein x, y and z respectively satisfy the relations $0 \leq x<2.9$, $0.02<y<0.4$, $0.95<z<1.4$.

On the other hand, as the phosphor for emitting the green light, it is preferable to use phosphors having at least one composition expressed by the following general formulas:

$$(Ba_{1-x}Eu_x)(Mg_{1-y}Mn_y)Al_{10}O_{17}$$

wherein x and y respectively satisfy the relations 0.05<x<0.5; and 0.1<y<0.6;

$$(Sr_{2-x-y-z-\omega}Ba_xMg_yMn_zEu_\omega)SiO_4$$

wherein x, y, z and ω respectively satisfy the relations $0.05<x<1$, $0 \leq y<0.2$, $0 \leq z<0.009$, $0.03<\omega<0.3$;

$$ZnS:Au_x,Al_y$$

wherein x and y respectively satisfy the relations $0.0002 \leq x \leq 0.015$, $0.0001 \leq y \leq 0.0012$;

$$(Sr_{1-x-y}Ca_xEu_y)Ga_2S_4$$

wherein x and y respectively satisfy the relations x<0.2, 0.05<y<0.3; and $$(Sr_{3-x}Eu_x)Si_yAl_zO_vN_\omega$$

wherein x, y, z, v and ω respectively satisfy the relations x<0.2, 12<y<14, 2<z<4, 1<v<3, 20<ω<22.

On the other hand, as the phosphor for emitting the red light, it is preferable to use phosphors having at least one composition expressed by the following general formulas:

$$(La_{1-x}Eu_xSm_y)_2O_2S$$

wherein x and y respectively satisfy the relations 0.01<x<0.2 and $0 \leq y \leq 0.2$;

$$(Ca_{1-x}Eu_x)AlSiN_3$$

wherein x satisfies the relation 0.005<x<0.03;

$$(Sr_{2-x-y-z-u}Ca_xMg_yEu_zMn_u)SiO_4$$

wherein x, y, z and u respectively satisfy the relations 0.05<x<0.4, 0.005<y<0.21, 0.05<z<0.3, 0.001<u<0.04; and $$(Ba_{3-x-y-z}Sr_xEu_yMn_z)Mg_\omega Si_2O_8$$

wherein x, y, z and w respectively satisfy the relations $0 \leq x<0.2$, $0.02<y<0.6$, $0.05<z<1.5$, $0.95<\omega<1.4$.

It is preferable that a grain size of the aforementioned blue, green, red phosphors is within a range of 5 to 50 μm. When the grain size of the phosphors is less than 5 μm, the luminance of the phosphor becomes in sufficient, and there is a tendency that a production efficiency of the phosphors is lowered. In contrast, when the grain size of the phosphors exceeds 50 μm, a density of the phosphor film (layer) is lowered, and there is a tendency that an edge portion of the phosphor stripe cannot be accurately formed.

Further, in a case where the display device is used under an outside light having a strong intensity, the outside light is radiated to the phosphor screen and reflected, so that the reflected light becomes one factor of lowering the image quality level. Such problem can be solved and improved by covering the phosphor with a pigment having the same body color as that of an emitted light color of the corresponding BGR phosphors.

As the representative pigment, a cobalt blue pigment (cobalt aluminate) is used for the blue phosphor, a viridian green (chromium hydroxide) for the green phosphor, a compound such as colcothar pigment (ferric oxide) is used for the red phosphor. These pigments absorb almost all of the outside light, and exhibit an effect of more clearly displaying the displayed image. However, in case of the phosphor per se having the body color, it is not always necessary to coat the pigment.

In a case where the display device of the present invention is exposed to a humidity condition, it is preferable that a protection layer having a high transparency is provided to the phosphor. As a material for achieving the above object, a dense inorganic material is suitable. For example, it is effective to use silica, alumina, titania, and compound or mixture thereof. When these materials are uniformly coated onto the surface of the phosphor, there can be obtained an effect of suppressing a transmission of moisture and a deterioration of the phosphor can be prevented.

In a case where the stripes of the blue, green, red phosphors are formed to the phosphor screen, it is preferable that a width of the phosphor stripe is set to a range of 10 to 2000 μm. When the stripe width exceeds 2000 μm, a tendency of lowering a definition degree of the image appears.

On the other hand, when the stripe width is less than 10 μm, a purity of the emitted light color is lowered due to a miss-landing of the laser light, and the phosphor stripes are liable to easily peel off at the time of forming of the phosphor screen, thus being not preferable.

Further, the illumination device of the present invention is configured to comprises: a laser diode for emitting a laser light having a peak wave length of 360 nm to 420 nm; and a phosphor film which is formed by mixing a phosphor for emitting blue light, a phosphor for emitting green light and a phosphor for emitting red light when the phosphors are excited by the laser light, wherein a visible light is obtained by radiating the laser light to the phosphor film.

Figure 9:
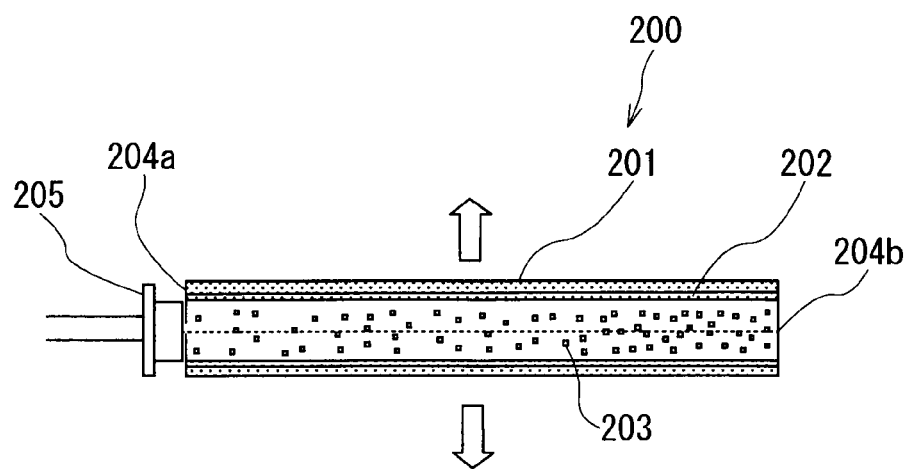
FIG. 9 is a cross sectional view schematically showing one embodiment of an illumination device according to the present invention.

Concretely, as shown in FIG. 9, the illumination device of the present invention has a structure in which three colors (B, G, R) of phosphors are coated onto an inner surface of a transparent and cylindrical glass tube 201, thereby to form a phosphor screen (phosphor film) 202. Then, a transparent resin such as silicone containing a laser scattering body 203 such as colloidal silica, colloidal alumina, potassium titanate or the like is prepared, and the transparent resin containing the laser scattering body 203 is imbedded into the cylindrical glass tube 201, thereby to constitute a cylindrical tube type laser illumination device.

Both ends of the cylindrical glass tube 201 are provided with laser light reflecting mirrors 204a, 204b. A laser diode 205 is provided so as to oppose to the laser light reflecting mirrors 204a. A laser light outputted from the laser diode 205 and having a wavelength of 360 nm to 420 nm is introduced from a fine hole of the laser light reflecting mirrors 204a to inside the cylindrical glass tube 201.

In the above illumination device, the laser light outputted from the laser diode 205 and having the wavelength of 360 nm to 420 nm is scattered by the laser scattering body 203 filled in the cylindrical glass tube 201 toward a tube wall direction, and then radiated to the phosphor screen. The radiated laser light effectively excites the phosphors, so that a white light is effectively outputted to outside the tube.

Figure 10:
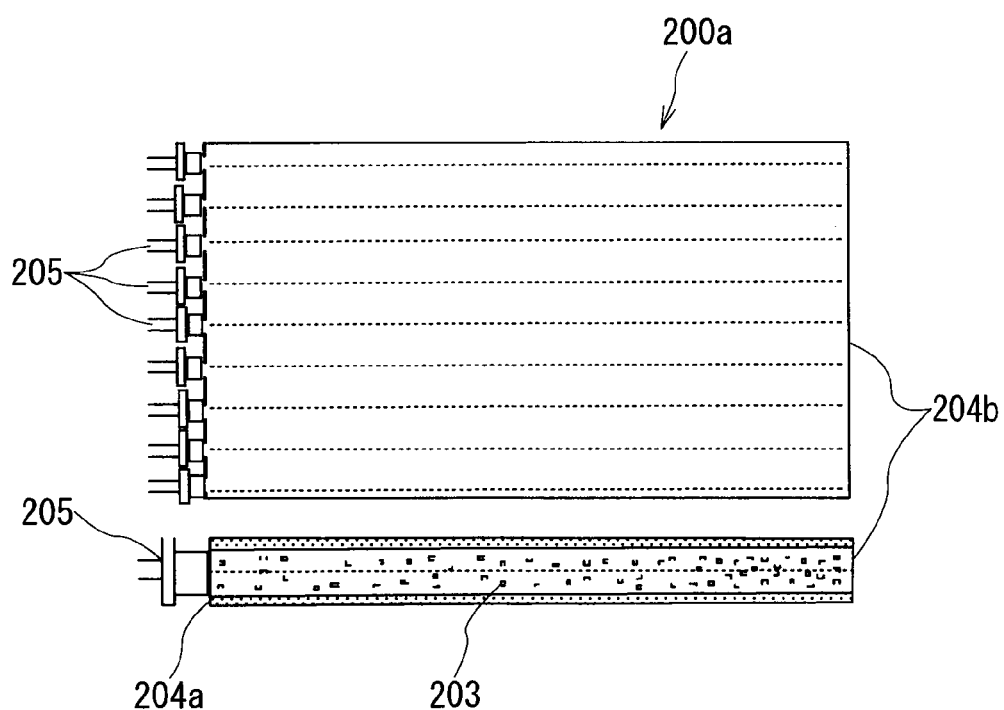
FIG. 10 is a plan view and a cross sectional view schematically showing another embodiment of an illumination device according to the present invention.
Figure 11:
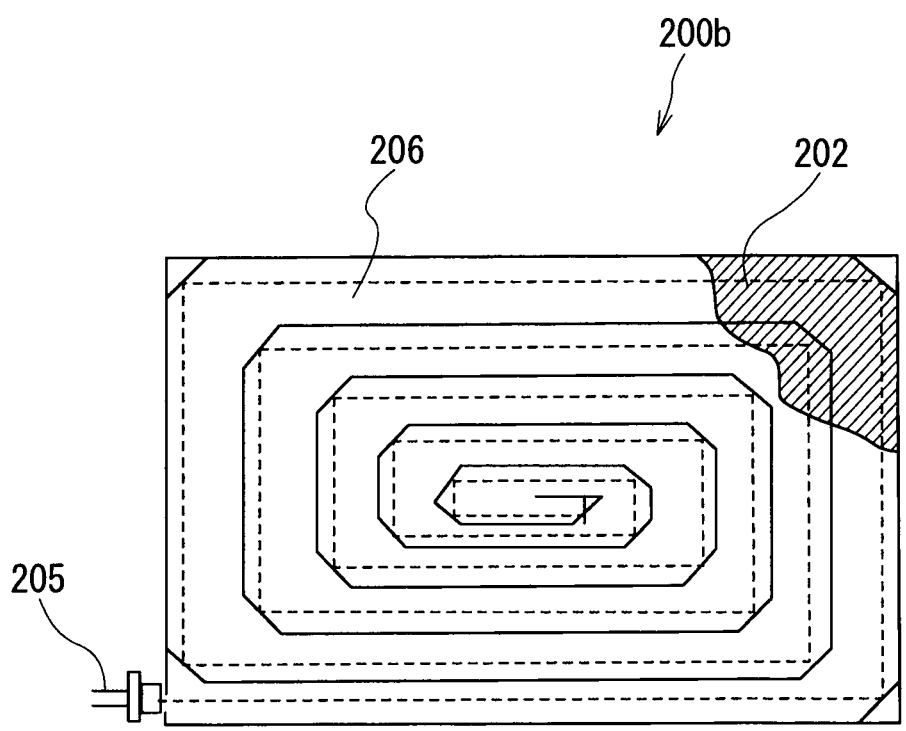
FIG. 11 is a plan view schematically showing still another embodiment of an illumination device according to the present invention.

By the way, it is also possible to configure a plane type laser illumination device 200a by continuously arranging a plurality of above illumination devices in a parallel form, as shown in FIG. 10. Further, it is also possible to configure another plane type laser illumination device, which is formed in such a manner that a cylindrical light path 206 is spirally formed. A phosphor film (phosphor screen) is formed to one surface or both surfaces of the spirally formed light path 206. Then, as the same manner, one end portion of the light path 206 is arranged with the laser diode 205 thereby to constitute another plane type laser illumination device 200b as shown in FIG. 11.

EXAMPLES

Examples of the present invention will be explained hereunder. However, the present invention is not limited thereto.

Phosphor powders used in Examples, Comparative Example and Reference Example are as follows.

[Blue Phosphor Powders]

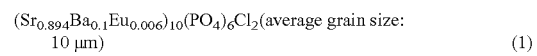

$$(Sr_{0.894}Ba_{0.1}Eu_{0.006})_{10}(PO_4)_6Cl_2 \text{(average grain size: 10 μm)} \quad (1)$$

Predetermined amounts of phosphates of strontium and barium, chlorides of strontium and barium and europium oxide were check-weighed, and mixed by using a ball mill for one hour to prepare a mixture. Thereafter, the mixture was calcined in a reducing atmosphere to synthesize a phosphor. The synthesized phosphor was then pulverized by using a mortar, followed by passing a sieve thereby to obtain a blue phosphor having an average grain size of 10 μm and having a composition: $((Sr_{0.894}Ba_{0.1}Eu_{0.006})_5(PO_4)_3Cl_2)$.

In this connection, the average grain size means a grain size $D_{50}$ which is measured as a grain size corresponding to a weight accumulated value of 50%. Hereinafter, the term "average grain size" is used as the same meaning as define above.

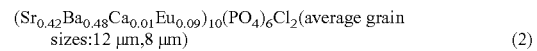

$$(Sr_{0.42}Ba_{0.48}Ca_{0.01}Eu_{0.09})_{10}(PO_4)_6Cl_2 \text{(average grain sizes:12 μm,8 μm)} \quad (2)$$

Predetermined amounts of phosphates of strontium and barium, chlorides of strontium and barium and europium oxide were check-weighed, and mixed by using a ball mill to prepare a mixture. Thereafter, the mixture was calcined in a reducing atmosphere to synthesize a phosphor. The synthesized phosphor was then pulverized by using a mortar, followed by passing a sieve thereby to obtain a blue phosphor having an average grain size of 12 μm and having a composition: $((Sr_{0.42}Ba_{0.48}Ca_{0.01}Eu_{0.09})_{10}(PO_4)_6Cl_2)$.

Using the same compound materials, and mixing condition, calcining temperature, calcining time, pulverizing condition and water washing condition or the like were controlled, thereby to obtain a blue phosphor having an average grain size of 8 μm and having a composition: $((Sr_{0.42}Ba_{0.48}Ca_{0.01}Eu_{0.09})_{10}(PO_4)_6Cl_2)$.

$$(Sr_{0.85}Ba_{0.01}Ca_{0.09}Eu_{0.05})_{10}(PO_4)_6Cl_2 \text{(average grain sizes:20 μm)} \quad (3)$$

Predetermined amounts of phosphates of strontium and barium, chlorides of strontium and barium and europium oxide were check-weighed, and mixed by using a ball mill for one hour to prepare a mixture. Thereafter, the mixture was calcined in a reducing atmosphere to synthesize a phosphor. The synthesized phosphor was then pulverized by using a mortar, followed by passing a sieve thereby to obtain a blue phosphor having an average grain size of 20 μm and having a composition: $((Sr_{0.85}Ba_{0.01}Ca_{0.09}Eu_{0.06})_{10}(PO_4)_6Cl_2)$.

$$(Sr_{0.44}Ba_{0.49}Ca_{0.02}Eu_{0.05})_{10}(PO_4)_6Cl_2 \text{(average grain sizes:40 μm)} \quad (4)$$

Predetermined amounts of phosphates of strontium and barium, chlorides of strontium and barium and europium oxide were check-weighed, and mixed by using a ball mill for one hour to prepare a mixture. Thereafter, the mixture was calcined in a reducing atmosphere to synthesize a phosphor. The synthesized phosphor was then pulverized by using a mortar, followed by passing a sieve thereby to obtain a blue phosphor having an average grain size of 40 μm and having a composition: $((Sr_{0.44}Ba_{0.49}Ca_{0.02}Eu_{0.05})_{10}(PO_4)_6Cl_2)$.

[Green Phosphor Powders]

$$(Ba_{0.32}Sr_{0.19}Ca_{0.01}Eu_{0.48})(Mg_{0.89}Mn_{0.11})Al_{10}O_{17} \text{ (average grain size:11 μm)} \quad (1)$$

Carbonates of each of Ba, Sr, Ca and Mn, Eu oxide, Mg oxide, Al oxide were blended in a predetermined composition ratio, and mixed by using a ball mill for one hour to prepare a mixture. Thereafter, the mixture was calcined in a reducing atmosphere to synthesize a phosphor. The synthesized phosphor was then pulverized by using a mortar, followed by passing a sieve thereby to obtain a green phosphor having an average grain size of 11 μm and having a composition: $((Ba_{0.32}Sr_{0.19}Ca_{0.01}Eu_{0.48})(Mg_{0.89}Mn_{0.11})Al_{10}O_{17})$.

$$(Ba_{0.975}Sr_{0.01}Ca_{0.009}Eu_{0.006})(Mg_{0.51}Mn_{0.49})Al_{10}O_{17} \text{ (average grain size:22 μm)} \quad (2)$$

Carbonates of each of Ba, Sr, Ca and Mn, Eu oxide, Mg oxide, Al oxide were blended in a predetermined composition ratio, and mixed by using a ball mill for one hour to prepare a mixture. Thereafter, the mixture was calcined in a reducing atmosphere to synthesize a phosphor. The synthesized phosphor was then pulverized by using a mortar, followed by passing a sieve thereby to obtain a green phosphor having an average grain size of 22 μm and having a composition: $((Ba_{0.975}Sr_{0.01}Ca_{0.009}Eu_{0.06})(Mg_{0.51}Mn_{0.49})Al_{10}O_{17})$.

$$(Ba_{0.799}Sr_{0.1}Ca_{0.001}Eu_{0.1})(Mg_{0.7}Mn_{0.3})Al_{10}O_{17} \text{(average grain size:25 μm)} \quad (3)$$

Carbonates of each of Ba, Sr, Ca and Mn, Eu oxide, Mg oxide, Al oxide were blended in a predetermined composition ratio, and mixed by using a ball mill for one hour to prepare a mixture. Thereafter, the mixture was calcined in a reducing atmosphere to synthesize a phosphor. The synthesized phosphor was then pulverized by using a mortar, followed by passing a sieve thereby to obtain a green phosphor having an average grain size of 25 μm and having a composition: $((Ba_{0.799}Sr_{0.1}Ca_{0.001}Eu_{0.1})(Mg_{0.7}Mn_{0.3})Al_{10}O_{17})$.

$$(Ba_{0.975}Sr_{0.01}Ca_{0.009}Eu_{0.006})(Mg_{0.7}Mn_{0.3})Al_{10}O_{17} \text{ (average grain size:8 μm)} \quad (4)$$

Carbonates of each of Ba, Sr, Ca and Mn, Eu oxide, Mg oxide, Al oxide were blended in a predetermined composition ratio, and mixed by using a ball mill for one hour to prepare a mixture. Thereafter, the mixture was calcined in a reducing atmosphere to synthesize a phosphor. The synthesized phosphor was then pulverized by using a mortar, followed by passing a sieve thereby to obtain a green phosphor having an average grain size of 8 μm and having a composition: $((Ba_{0.975}Sr_{0.01}Ca_{0.009}Eu_{0.006})(Mg_{0.7}Mn_{0.3})Al_{10}O_{17})$.

[Yellow Phosphor Powders]

$$ZnS:Au_{0.0002}Al_{0.0002} \text{(average grain size:22 μm)} \quad (1)$$

Predetermined amounts of gold (Au) and aluminum (Al) materials were mixed with ZnS grains to prepare a mixture. Thereafter, the mixture was calcined thereby to obtain a yellow phosphor having an average grain size of 22 μm and having a composition: $(ZnS:Au_{0.0002}Al_{0.0002})$.

$$(Sr_{1.58}Ba_{0.11}Mg_{0.2}Eu_{0.1}Mn_{0.01})SiO_4 \text{(average grain size:30 μm)} \quad (2)$$

Carbonates of each of Ba, Sr and Mn, Eu oxide, Mg oxide were blended in a predetermined composition ratio, and mixed by using a ball mill for one hour to prepare a mixture. Thereafter, the mixture was calcined in a reducing atmosphere to synthesize a phosphor. The synthesized phosphor was then pulverized by using a mortar, followed by passing a sieve thereby to obtain a yellow phosphor having an average grain size of 11 μm and having a composition: $((Sr_{1.58}Ba_{0.11}Mg_{0.2}Eu_{0.1}Mn_{0.01})SiO_4)$.

[Red Phosphor Powders]

$$(La_{0.98}Eu_{0.02})_2O_2S \text{(average grain size:10 μm)} \quad (1)$$

Predetermined amounts of lanthanum oxide and europium oxide were mixed with sulfa powder to prepare a mixture. Thereafter, the mixture was calcined thereby to obtain a red phosphor having an average grain size of 10 μm and having a composition: $(La_{0.98}Eu_{0.02})_2O_2S$.

$$(La_{0.86}Eu_{0.14})_2O_2S \text{(average grain size:7 μm)} \quad (2)$$

Predetermined amounts of lanthanum oxide and europium oxide were mixed with sulfa powder to prepare a mixture. Thereafter, the mixture was calcined thereby to obtain a red phosphor having an average grain size of 10 μm and having a composition: $(La_{0.86}Eu_{0.14})_2O_2S$.

$$(La_{0.859}Eu_{0.14}Ga_{0.001})_2O_2S \text{(average grain size:40 μm)} \quad (3)$$

Predetermined amounts of lanthanum oxide, gallium oxide and europium oxide were mixed with sulfa powder to prepare a mixture. Thereafter, the mixture was calcined thereby to obtain a red phosphor having an average grain size of 40 μm and having a composition: $(La_{0.859}Eu_{0.14}Ga_{0.001})_2O_2S$.

$$(Sr_{0.39}Ca_{0.61})SiAlN_3:Eu \text{(average grain size:18 μm)} \quad (4)$$

Predetermined amounts of strontium nitride, calcium nitride, silicon nitride aluminum nitride and europium nitride were mixed to prepare a mixture. Thereafter, the mixture was calcined thereby to obtain a red phosphor having an average grain size of 18 μm and having a composition: $(Sr_{0.39}Ca_{0.61})SiAlN_3:Eu$.

$$(Sr_{0.01}Ca_{099})SiAlN_3:Eu \text{(average grain size:25 μm)} \quad (5)$$

Predetermined amounts of strontium nitride, calcium nitride, silicon nitride aluminum nitride and europium nitride were mixed to prepare a mixture. Thereafter, the mixture was calcined thereby to obtain a red phosphor having an average grain size of 25 μm and having a composition: $(Sr_{001}Ca_{099})SiAlN_3:Eu$.

Example 1

Preparation of White LED Lamp

The following procedures of "mounting of light emitting diode chip", "forming of transparent resin layer", "preparation of phosphor slurry" and "forming of phosphor layer" were conducted thereby to manufacture a white LED lamp.

(Mounting of Light Emitting Diode Chip)

Among two Ag electrodes provided to a surface of an aluminum nitride substrate, InGaN type light emitting diode chip (length:0.4 mm×width:0.4 mm×height:0.15 mm) was mounted and adhered onto a surface of one Ag electrode using an AuSn solder.

A top portion of this light emitting diode chip and a surface of another Ag electrode were electrically connected to each other using a bonding wire. Both the two Ag electrodes are light reflecting electrodes each having a glitter surface.

(Forming of Transparent Resin Layer)

Using a dimethyl silicone resin, the light emitting diode chip and the wire bonding were sealed by the transparent resin thereby to form a transparent resin layer. That is, at first, a rectangular-shaped molding die having a rectangular shape in section, which is referred to as "a first rectangular-shaped molding die", was used. The first rectangular-shaped molding die was disposed on the aluminum nitride (AlN) substrate so that the light emitting diode chip and the bonding wire were arranged in the first rectangular-shaped molding die.

Next, the silicone resin was poured in the first rectangular-shaped molding die, followed by heat-treating the silicone resin at a temperature of 140° C. for 10 minutes thereby to harden (cure) the silicone resin. After the silicone resin was hardened, when the first rectangular-shaped molding die, was removed, there could be obtained a sealed product (substance) having a rectangular-parallelepiped-shape, wherein the light emitting diode chip and the bonding wire were sealed by the transparent resin. Each of thicknesses t1, t2, t3, and t4 of the transparent resin were 0.2 mm, while a thickness t5 of the transparent resin layer was 1.2 mm.

(Forming of Transparent Resin Layer)

The same silicone resin as used in the formation of the transparent resin layer, and the respective kind of phosphor powders were blended at a predetermined ratio, thereby to prepare the respective phosphor slurries.

The phosphor slurry was prepared for each of BGR phosphors of: a blue phosphor powder $(Sr_{0.894}Ba_{0.1}Eu_{0.006})_{10}(PO_4)_6Cl_2$ having an average grain size of 10 μm; a green phosphor powder $(Ba_{0.32}Sr_{0.19}Ca_{0.01}Eu_{0.48})(Mg_{0.89}Mn_{0.11})Al_{10}O_{17}$ having an average grain size of 11 μm; and a red phosphor powder $(La_{0.98}Eu_{0.02})_2O_2S$ having an average grain size of 10 μm.

A blending ratio (mixing ratio) of the phosphor powder with respect to the silicone resin in the phosphor slurry was set to 80 mass % for each of the blue, green and red phosphor powders.

Table 1 shows kinds of the phosphor powders used for preparing the phosphor slurries.

(Formation of Phosphor Layer)

The three kinds of the phosphor slurries for the respective B, G, R phosphor powders were mixed at a predetermined mixing ratio so that a chromaticity of a light emitted from the LED lamp exhibited a chromaticity (x=0.28, y=0.23) in an XYZ color system prescribed by CIE (International Commission on Illumination), thereby to prepare a mixed phosphor slurry. A mixing ratio of a total phosphor powders with respect to the silicone resin was set to 80 mass % which is the same value as those of the respective B, G, R phosphor slurries.

Next, Using this mixed phosphor slurry, there was manufactured a white LED lamp in which a surface of the transparent resin layer of the above sealed product was covered with a phosphor layer. That is, at first, a rectangular-shaped molding die having a rectangular shape in section, which is referred to as "a second rectangular-shaped molding die", was used. The second rectangular-shaped molding die was disposed on the aluminum nitride (AlN) substrate so that the above sealed product (substance) was arranged in the second rectangular-shaped molding die.

Next, the mixed phosphor slurry resin was poured (dropped) in the second rectangular-shaped molding die, followed by heat-treating the mixed phosphor slurry at a temperature of 140° C. for 10 minutes thereby to harden (cure) the mixed phosphor slurry. After the mixed phosphor slurry was hardened, when the second rectangular-shaped molding die was removed, there could be obtained a white LED lamp having a rectangular-parallelepiped-shape, wherein the light emitting diode chip and the wire bonding were covered with the transparent resin layer and the phosphor layer. Each of thicknesses T1, T2, T3, T4 and T5 of the phosphor layer of the white LED lamp were 0.1 mm.

[Evaluation of White LED Lamp]

(Evaluation of Emission Property of White LED Lamp)

With respect to thus manufactured white LED lamp, light emission properties were measured and evaluated by using a total luminous flux measuring device (SMLS, manufactured by Labsphere Co., Ltd.) and a momentary multiple photometry system (MCPD, manufactured by Otsuka Electron Co., Ltd.

A current of 30 mA was applied to the white LED lamp thereby to measure a voltage. As a result, the voltage was 3.3 V.

An outgoing light emitted from the white LED lamp had a light flux of 2 lm, and x value was 0.28 and y value was 0.23 in terms of the chromaticity (x, y) in XYZ color system of CIE.

The light outputted from the white LED lamp contained a residual primary light having an emission peak wavelength of 399 nm and a peak intensity of 0.032 mW/nm at a current of 30 mA. The residual primary light means a part of light emitted from the light emitting diode chip and outputted from the white LED lamp. Among the spectrum of the light outputted from the white LED lamp, when a spectrum intensity (a spectrum intensity of the residual primary light) of a wavelength ranging from 360 nm to 410 nm was integrated, an energy of the residual primary light was 0.58 mW.

Further, the light outputted from the white LED lamp contained a blue light (a secondary light emitted from the blue phosphor powder) having a peak wavelength of 447 nm and an emission peak intensity of 0.10 mW/nm at a current of 30 mA.

Based on the above data, a luminous efficiency of the white LED lamp, an energy of a light having a wavelength ranging from 360 nm to 410 nm per total luminous flux (hereinafter, referred to as "an energy of the residual primary light per total luminous flux"), and a ratio of an emission peak intensity of the residual primary light with respect to an emission peak intensity of the blue color light (an emission peak intensity of the residual primary light/an emission peak intensity of the blue color light) (hereinafter, referred to as "a peak intensity ratio") were calculated.

The luminous efficiency was calculated to be 20 lm/W from a calculation formula of 2 lm/(30 mA·3.3V)). Further, the energy of the residual primary light per total luminous flux was calculated to be about 0.3 mW/lm from a calculation formula of 0.58 mW/2 lm.

The peak intensity ratio was calculated to be 0.32 from a calculation formula of (0.032 mW/nm) to (0.10 mW/nm).

Furthermore, with respect to the white LED lamp, a junction temperature Tj of the light emitting diode chip was measured by using a ΔVf method. Concretely, under a state where the white LED lamp was held in the air, and measuring conditions were set as follows: a measuring current was 100 μm; a heating current was 30 mA; a heating time was 30 minutes; and a time interval from a time when the heating current was OFF to a time when the measuring current was ON was set to 200 μsec, thereby to measure the junction temperature Tj. In addition, with respect to the white LED lamp, a temperature Ts of a rear surface of the substrate when applying the heating current was measured by means of a thermo couple.

Further, with respect to the white LED lamp, a thermal resistance Rth between the junction portion and the rear surface of the substrate was also calculated. The thermal resistance Rth was calculated by using above the junction temperature Tj and the temperature of the rear surface of the substrate. The thermal resistance Rth was calculated to be 7° C./W from a calculation formula of (Tj−Ts)/(30 mA·3.3 V).

A part of the measured results are indicated in Table 2.

(Evaluation of Yellow Discoloration for Brightness Enhancement Film)

16 pieces of thus obtained white LED lamps were mounted on a copper-clad liquid crystal polymer laminated plate by using a Pb-free solder. Thus obtained FPC board (flexible printed-circuit board) was adhered to a heat sink comprising aluminum-fins by using a thermal conductive adhesive agent (manufactured by Sun-Hayato CO., Ltd). Onto these white LED lamps, a sheet-shaped and resin-formed luminance increasing film (brightness enhancement film: DBEF-D400; manufactured by Sumitomo 3-M Co., Ltd.) was disposed. Thereafter, under this state, the white LED lamps ware turned on, under operating conditions for an environmental temperature was 90° C. and a current of 30 mA.

After the white LED lamps were turned on for 2000 hours, a transmission factor of the brightness enhancement film with respect to a light having a wavelength of 400 nm was measured. As a result, a yellow discoloration was not observed at all even after turning on the lamps for 2000 hours, and the transmission factor after turning on the lamps for 2000 hours was 97% in comparison with the transmission factor of 100% at a time before turning on the lamps.

Ratios of the transmission factors after turning on the lamps for 2000 hours with respect to the transmission factors before turning on the lamps were indicated in Table 2.

Reference Example 1

A commercially available liquid crystal module was disassembled thereby to take out a CCFL (Cold Cathode Fluorescent Lamp). The same procedures were repeated except that the cold cathode fluorescent lamp was used in place of the white LED lamp thereby to evaluate the yellow discoloration of the brightness enhancement film. As a result, the yellow discoloration was hardly observed even after turning on the lamps for 2000 hours, and the transmission factor after turning on the lamps for 2000 hours was 90% in comparison with the transmission factor of 100% at a time before turning on the lamps.

Example 2

Preparation of White LED Lamp

The following procedures of "mounting of light emitting diode chip", "forming of transparent resin layer", "preparation of phosphor slurry" and "forming of phosphor layer" were conducted thereby to manufacture a white LED lamp.

(Mounting of Light Emitting Diode Chip)

Among two Pt electrodes provided to a surface of a glass epoxy resin substrate (FR-4), the light emitting diode chip as the same one as used in Example 1 was mounted and adhered onto a surface of one Pt electrode by using an Ag paste.

A top portion of this light emitting diode chip and a surface of another Pt electrode were electrically connected to each other using a wire bonding. Both the two Pt electrodes are light reflecting electrodes each having a glitter surface.

(Forming of Transparent resin Layer)

The same procedures as in Example 1 were conducted except that the thicknesses t1, t2, t3, and t4 of the transparent resin layer were respectively set to 0.3 mm, thereby to seal the light emitting diode chip and the bonding wire by the transparent resin, so that a transparent resin layer was formed.

(Forming of Transparent Resin Layer)

The same silicone resin as used in the formation of the transparent resin layer of Example 1, and the respective kind of phosphor powders were blended at a predetermined ratio, thereby to prepare the respective phosphor slurries.

The phosphor slurry was prepared for each of B, G, Y, R phosphors of: a blue phosphor powder $((Sr_{0.42}Ba_{0.48}Ca_{0.01}Eu_{0.09})_{10}(PO_4)_6Cl_2)$ having an average grain size of 12 μm; a green phosphor powder $((Ba_{0.975}Sr_{0.01}Ca_{0.009}Eu_{0.006})(Mg_{0.51}Mn_{0.49})Al_{10}O_{17})$ having an average grain size of 22 μm; a yellow phosphor powder $(ZnS:Au_{0.0002}Al_{0.0002})$ having an average grain size of 22 μm; and a red phosphor powder $((Sr_{0.39}Ca_{0.61})SiAlN_3:Eu)$ having an average grain size of 18 μm.

A blending ratio (mixing ratio) of the phosphor powder with respect to the silicone resin in the phosphor slurry was set to 80 mass % for each of the blue, green, yellow and red phosphor powders.

Table 1 shows kinds of the phosphor powders used for preparing the phosphor slurries.

(Formation of Phosphor Layer)

The four kinds of the phosphor slurries for the respective B, G, Y, R phosphor powders were mixed at a predetermined mixing ratio so that a chromaticity of a light emitted from the LED lamp exhibited a chromaticity (x=0.28, y=0.23) in an XYZ color system prescribed by CIE (International Commission on Illumination), thereby to prepare a mixed phosphor slurry. A mixing ratio of a total phosphor powders with respect to the silicone resin was set to 80 mass % which is the same value as those of the respective B, G, Y, R phosphor slurries.

Next, Using this mixed phosphor slurry, the same procedures as in Example 1 were repeated except that each of thicknesses T1, T2, T3, T4 and T5 of the phosphor layer of the white LED lamp were set to 0.2 mm thereby to manufacture a white LED lamp.

[Evaluation of White LED Lamp]

(Evaluation of Emission Property of white LED Lamp)

With respect to thus manufactured white LED lamp, as the same manner as in Example 1, the light emission properties were measured and evaluated.

An outgoing light emitted from the white LED lamp had a light flux of 4 lm, and x value was 0.28 and y value was 0.23 in terms of the chromaticity (x, y) in XYZ color system of CIE.

As the same as in Example 1, the light outputted from the white LED lamp contained a residual primary light having an emission peak wavelength of 399 nm and a peak intensity of 0.0026 mW/nm at a current of 30 mA.

Further, the light outputted from the white LED lamp contained a blue light having an emission peak wavelength of 452 nm and an emission peak intensity of 0.08 mW/nm at a current of 30 mA.

Based on the above data, as the same manner as in Example 1, a luminous efficiency of the white LED lamp, an energy of a residual primary light per total luminous flux, and a ratio of an emission peak intensity were calculated.

The luminous efficiency was calculated to be 40 lm. Further, the energy of the residual primary light per total luminous flux was calculated to be 0.01 mW/lm, and the peak intensity ratio was calculated to be 0.032.

Furthermore, with respect to the white LED lamp, as the same manner as in Example 1, a thermal resistance Rth between the junction portion and the rear surface of the substrate was also calculated. The thermal resistance Rth was 40° C./W.

A part of the measured results are indicated in Table 2.

(Evaluation of Yellow Discoloration for Brightness Enhancement Film)

The same procedures as in Example 1 were repeated except that 8 pieces of thus obtained white LED lamps were used, thereby to evaluate the yellow-discoloration of the brightness enhancement film.

As a result, a yellow discoloration of the brightness enhancement film was not observed at all even after turning on the white LED lamps for 2000 hours, and the transmission factor after turning on the lamps for 2000 hours was 99% in comparison with the transmission factor of 100% at a time before turning on the lamps.

Ratios of the transmission factors after turning on the lamps for 2000 hours with respect to the transmission factors before turning on the lamps were indicated in Table 2.

In view of the above experimental sample (Example 2), the following fact was confirmed. Namely, even in a case where a substrate such as the glass epoxy resin substrate having a poor heat radiating property was used, when a selection of phosphor powder and a thickness of the phosphor layer were suitably optimized and the energy of the residual primary light per total light flux was reduced, so that the yellow discoloration of the brightness enhancement film could be effectively suppressed.

Example 3

Preparation of White LED Lamp

The following procedures of "mounting of light emitting diode chip", "forming of transparent resin layer", "preparation of phosphor slurry" and "forming of phosphor layer" were conducted thereby to manufacture a white LED lamp.

(Mounting of Light Emitting Diode Chip)

There was prepared a resin package in which two Cu lead portions (lead frames) subjected to Ag plating were fixed to a package body by using epoxy resin. Then, the light emitting diode chip as used in Example 1 was mounted and adhered onto one Cu lead portion by using an Ag paste.

A top portion of this light emitting diode chip and a surface of another Cu lead portion were electrically connected to each other using a wire bonding.

(Formation of Transparent Resin Layer)

The same procedures as in Example 1 were conducted except that the thicknesses t1, t2, t3, and t4 of the transparent resin layer were respectively set to 0.4 mm, thereby to seal the light emitting diode chip and the bonding wire by the transparent resin, so that a transparent resin layer was formed.

(Preparation of Phosphor Slurry)

The same silicone resin as used in the formation of the transparent resin layer of Example 1, and the respective kind of phosphor powders were blended at a predetermined ratio, thereby to prepare the respective phosphor slurries.

The phosphor slurry was prepared for each of B, G, R phosphors of: a blue phosphor powder $((Sr_{0.85}Ba_{0.01}Ca_{0.09}Eu_{0.05})_{10}(PO_4)_6Cl_2)$ having an average grain sizes of 20 µm; a green phosphor powder $((Ba_{0.799}Sr_{0.1}Ca_{0.001}Eu_{0.01})(Mg_{0.7}Mn_{0.3})Al_{10}O_{17})$ having an average grain size of 25 µm; and a red phosphor powder $((Sr_{0.01}Ca_{0.99})SiAlN_3:Eu)$ having an average grain size of 25 µm.

A blending ratio (mixing ratio) of the phosphor powder with respect to the silicone resin in the phosphor slurry was set to 40 mass % for each of the blue, green, and red phosphor powders.

Table 1 shows kinds of the phosphor powders used for preparing the phosphor slurries.

(Formation of Phosphor Layer)

The three kinds of the phosphor slurries for the respective B, G, R phosphor powders were mixed at a predetermined mixing ratio so that a chromaticity of a light emitted from the LED lamp exhibited a chromaticity (x=0.28, y=0.23) in an XYZ color system prescribed by CIE (International Commission on Illumination), thereby to prepare a mixed phosphor slurry. A mixing ratio of a total phosphor powders with respect to the silicone resin was set to 40 mass % which is the same value as those of the respective B, G, R phosphor slurries.

Next, Using this mixed phosphor slurry, the same procedures as in Example 1 were repeated except that each of thicknesses T1, T2, T3, T4 and T5 of the phosphor layer of the white LED lamp were set to 0.2 mm thereby to manufacture a white LED lamp.

[Evaluation of White LED Lamp]

(Evaluation of Emission Property of white LED Lamp)

With respect to thus manufactured white LED lamp, as the same manner as in Example 1, the light emission properties were measured and evaluated.

An outgoing light emitted from the white LED lamp had a light flux of 3 lm, and x value was 0.28 and y value was 0.23 in terms of the chromaticity (x, y) in XYZ color system of CIE.

As the same as in Example 1, the light outputted from the white LED lamp contained a residual primary light having an emission peak wavelength of 399 nm and a peak intensity of 0.1 mW/nm at a current of 30 mA.

Further, the light outputted from the white LED lamp contained a blue light having an emission peak wavelength of 445 nm and an emission peak intensity of 0.2 mW/nm at a current of 30 mA.

On the basis of the above data, as the same manner as in Example 1, a luminous efficiency of the white LED lamp, an energy of a residual primary light per total luminous flux, and a ratio of an emission peak intensity were calculated.

The luminous efficiency was calculated to be 30 lm/W. Further, the energy of the residual primary light per total luminous flux was calculated to be 0.4 mW/lm, and the peak intensity ratio was calculated to be 0.5.

Furthermore, with respect to the white LED lamp, as the same manner as in Example 1, a thermal resistance Rth between the junction portion and the rear surface of the substrate was also calculated. The thermal resistance Rth was 4° C./W.

A part of the measured results are indicated in Table 2.

(Evaluation of Yellow Discoloration for Brightness Enhancement Film)

The same procedures as in Example 1 were repeated except that 11 pieces of thus obtained white LED lamps were used, thereby to evaluate the yellow-discoloration of the brightness enhancement film.

As a result, a yellow discoloration of the brightness enhancement film was not substantially observed at all even after turning on the white LED lamps for 2000 hours, and the transmission factor after turning on the lamps for 2000 hours was 90% in comparison with the transmission factor of 100% at a time before turning on the lamps.

Ratios of the transmission factors after turning on the lamps for 2000 hours with respect to the transmission factors before turning on the lamps were indicated in Table 2.

In view of the above experimental sample (Example 3), the following fact was confirmed. Namely, even in a case where the resin package (corresponding to a substrate) having a good heat radiating property was used, an amount of the energy of the residual primary light per total light flux was relatively large, so that an effect of suppressing the yellow discoloration of the brightness enhancement film would be somewhat lowered.

Example 4

Preparation of White LED Lamp

The following procedures of "mounting of light emitting diode chip", "forming of transparent resin layer", "preparation of phosphor slurry" and "forming of phosphor layer" were conducted thereby to manufacture a white LED lamp.

(Mounting of Light Emitting Diode Chip)

There was prepared an alumina substrate in which seven electrode pads each composed of aluminum were serially arranged. Then, the light emitting diode chip as used in Example 1 was mounted and adhered onto each surface of the electrode pads by using an Ag—Sn eutectic solder.

Each of top portions of these light emitting diode chips and each of the surfaces of the electrode pads were electrically connected in series to each other using a bonding wire. Each of the electrode pads is a light reflecting electrode having a glitter surface.

(Forming of Transparent Resin Layer)

The same procedures as in Example 1 were conducted except that a first rectangular-shaped molding die capable of simultaneously incorporating the seven light emitting diode chips and the bonding wires was used, thereby to seal the light emitting diode chips and the bonding wires by the transparent resin as the same manner as in Example 1, so that a transparent resin layer was formed.

(Preparation of Phosphor Slurry)

The same silicone resin as used in the formation of the transparent resin layer of Example 1, and the respective kind of phosphor powders were blended at a predetermined ratio, thereby to prepare the respective phosphor slurries.

The phosphor slurry was prepared for each of B, Y, R phosphors of: a blue phosphor powder $((Sr_{0.44}Ba_{0.49}Ca_{0.02}Eu_{0.05})_{10}(PO_4)_6Cl_2)$ having an average grain sizes of 40 μm; a yellow phosphor powder $((Sr_{1.58}Ba_{0.11}Mg_{0.2}Eu_{0.1}Mn_{0.01})SiO_4)$ having an average grain size of 30 μm; and a red phosphor powder $((La_{0.859}Eu_{0.14}Ga_{0.001})_2O_2S)$ having an average grain size of 40 μm.

A blending ratio (mixing ratio) of the phosphor powder with respect to the silicone resin in the phosphor slurry was set to 70 mass % for each of the blue, yellow, and red phosphor powders.

Table 1 shows kinds of the phosphor powders used for preparing the respective phosphor slurries.

(Formation of Phosphor Layer)

The three kinds of the phosphor slurries for the respective B (blue), Y (yellow), R (red) phosphor powders were mixed at a predetermined mixing ratio so that a chromaticity of a light emitted from the LED lamp exhibited a chromaticity (x=0.28, y=0.23) in an XYZ color system prescribed by CIE, thereby to prepare a mixed phosphor slurry. A mixing ratio of a total phosphor powders with respect to the silicone resin was set to 70 mass % which is the same value as those of the respective B, Y, R phosphor slurries.

Next, Using this mixed phosphor slurry, the same procedures as in Example 1 were repeated except that each of thicknesses T1, T2, T3, T4 and T5 of the phosphor layer of the white LED lamp were set to 0.7 mm thereby to manufacture a white LED lamp.

[Evaluation of White LED Lamp]

(Evaluation of Emission Property of White LED Lamp)

With respect to thus manufactured white LED lamp, as the same manner as in Example 1, the light emission properties were measured and evaluated.

An outgoing light emitted from the white LED lamp had a light flux of 32 lm, and x value was 0.28 and y value was 0.23 in terms of the chromaticity (x, y) in XYZ color system of CIE.

As the same as in Example 1, the light outputted from the white LED lamp contained a residual primary light having an emission peak wavelength of 399 nm and a peak intensity of 0.021 mW/nm at a current of 30 mA.

Further, the light outputted from the white LED lamp contained a blue light having an emission peak wavelength of 451 nm and an emission peak intensity of 0.7 mW/nm at a current of 30 mA.

Based on the above data, as the same manner as in Example 1, a luminous efficiency of the white LED lamp, energy of a residual primary light per total luminous flux, and a ratio of an emission peak intensity were calculated.

The luminous efficiency was calculated to be 45 lm. Further, the energy of the residual primary light per total luminous flux was calculated to be 0.01 mW/lm, and the peak intensity ratio was calculated to be 0.03.

Furthermore, with respect to the white LED lamp, as the same manner as in Example 1, a thermal resistance Rth between the junction portion and the rear surface of the substrate was also calculated. As a result, the thermal resistance Rth per one chip was 40° C./W.

A part of the measured results are indicated in Table 2.

(Evaluation of Yellow Discoloration for Brightness Enhancement Film)

The same procedures as in Example 1 were repeated except that 1 piece of thus obtained white LED lamp was used, thereby to evaluate the yellow-discoloration of the brightness enhancement film. The white LED lamp contained seven light emitting diodes.

As a result, a yellow discoloration of the brightness enhancement film was not substantially observed at all even after turning on the white LED lamps for 2000 hours, and the transmission factor after turning on the lamp for 2000 hours was 99% in comparison with the transmission factor of 100% at a time before turning on the lamps.

Ratios of the transmission factors after turning on the lamps for 2000 hours with respect to the transmission factors before turning on the lamps were indicated in Table 2.

(Calculation of Lighting Hours until Discoloration)

A damage factor of the white LED lamp was calculated from the spectrum obtained at the time of evaluation of the light emitting property. The calculated damage factor was very small to be 0.007, thus being excellent.

On the basis of this damage factor, a lighting hours (lighting time) until the discoloration is occurred to a sample, when the light is radiated to the sample, was calculated. The lighting hours until the discoloration is occurred can be calculated by the following formula:

(MPF peculiar to the sample when using a white fluorescent lamp/illumination intensity)×(damage factor of the white fluorescent lamp/damage factor of the white LED lamp)

In this regard, the term MPF means a "minimum perceptible fading".

In a case where the sample composed of 85% wool and 15% nylon was used, MPF was 960000 lx-hour. Further, the damage factor of the white fluorescent lamp was 0.022. From these data, when the sample was radiated by a light emitted from the white LED lamp of this Example at an illumination intensity of 750 lx, the lighting hours until the discoloration was occurred to the sample was calculated by the following calculation formula: (960000 lx-hour/750 lx)×(0.022/0.007). As a result, the illumination hours was calculated to be 4023 hours.

In a case where the white fluorescent lamp having the damage factor of 0.022 was used in place of the white LED lamp of this Example, a lighting hours until the discoloration was occurred to the sample was 1280 hours. From this fact, it can be confirmed that the lighting hours until the discoloration was occurred in case of the white LED lamp of this Example is about three times larger than that of the white fluorescent lamp.

Comparative Example 1

Preparation of White LED Lamp

The same procedures as in Example 3 were repeated except that each of thicknesses T1, T2, T3, T4 and T5 of the phosphor layer of the white LED lamp were set to 0.2 mm thereby to manufacture a white LED lamp.

[Evaluation of White LED Lamp]
(Evaluation of Emission Property of white LED Lamp)

With respect to thus manufactured white LED lamp, as the same manner as in Example 1, the light emission properties were measured and evaluated.

An outgoing light emitted from the white LED lamp had a light flux of 3.2 lm, and x value was 0.28 and y value was 0.23 in terms of the chromaticity (x, y) in XYZ color system of CIE.

As the same as in Example 1, the light outputted from the white LED lamp contained a residual primary light having an emission peak wavelength of 399 nm and a peak intensity of 0.106 mW/nm at a current of 30 mA.

Further, the light outputted from the white LED lamp contained a blue light having an emission peak wavelength of 445 nm and an emission peak intensity of 0.2 mW/nm at a current of 30 mA.

Based on the above data, as the same manner as in Example 1, a luminous efficiency of the white LED lamp, an energy of a residual primary light per total luminous flux, and a ratio of an emission peak intensity were calculated.

The luminous efficiency was calculated to be 32 lm/W. Further, the energy of the residual primary light per total luminous flux was calculated to be 0.45 mW/lm, and the peak intensity ratio was calculated to be 0.53.

Furthermore, with respect to the white LED lamp, as the same manner as in Example 1, a thermal resistance Rth between the junction portion and the rear surface of the substrate was also calculated. The thermal resistance Rth was 4° C./W.

A part of the measured results are indicated in Table 2.

(Evaluation of Yellow Discoloration for Brightness Enhancement Film)

The same procedures as in Example 1 were repeated except that 10 pieces of thus obtained white LED lamps were used, thereby to evaluate the yellow-discoloration of the brightness enhancement film.

As a result, a yellow discoloration of the brightness enhancement film was observed after turning on the white LED lamps for 2000 hours, and the transmission factor after turning on the lamps for 2000 hours was 87% in comparison with the transmission factor of 100% at a time before turning on the lamps.

Ratios of the transmission factors after turning on the lamps for 2000 hours with respect to the transmission factors before turning on the lamps were indicated in Table 2.

In view of the above experimental sample (Comparative Example 1), the following fact was confirmed. Namely, in a case where the thickness of the phosphor layer is thin, the brightness enhancement film caused the yellow discoloration.

Comparative Example 2

Preparation of White LED Lamp

A white LED lamp was manufactured in accordance with the following procedures.

Comparative Example 2

Preparation of White LED Lamp

The following procedures of "mounting of light emitting diode chip", "preparation of phosphor slurry" and "forming of phosphor layer" were conducted thereby to manufacture a white LED lamp.

(Mounting of Light Emitting Diode Chip)

As the same manner as in Example 2, the light emitting diode chip was mounted and adhered onto the glass epoxy resin substrate.

(Preparation of Phosphor Slurry)

As the same manner as in Example 3, the phosphor slurry was prepared for each of a blue phosphor powder, a green phosphor powder and a red phosphor powder.

Table 1 shows kinds of the phosphor powders used for preparing the phosphor slurries.

(Formation of Phosphor Layer)

As the same manner as in Example 3, the three kinds of the phosphor slurries for the respective B, G, R phosphor powders were mixed, thereby to prepare a mixed phosphor slurry.

The light emitting diode chip and the bonding wire were sealed by the mixed phosphor slurry and a a phosphor layer was formed thereby to manufacture a white LED lamp. That is, at first, a rectangular-shaped molding die having a rectangular shape in section, which is referred to as "a first rectangular-shaped molding die", was used. The first rectangular-shaped molding die was disposed on a glass epoxy resin substrate so that the light emitting diode chip and the bonding wire were arranged in the first rectangular-shaped molding die.

Next, the mixed phosphor slurry was poured in the first rectangular-shaped molding die, followed by heat-treating the silicone resin at a temperature of 140° C. for 10 minutes thereby to harden (cure) the mixed phosphor slurry. After the mixed phosphor slurry was hardened, when the first rectangular-shaped molding die, was removed, there could be obtained a white LED lamp having a rectangular-parallelepiped-shape, wherein the light emitting diode chip and the bonding wire were sealed by the phosphor layer. Each of thicknesses T1, T2, T3, T4 and T5 of the phosphor layer of the white LED lamp were 0.2 mm, while a thickness t5 of the transparent resin layer was 1.2 mm.

Figure 4:
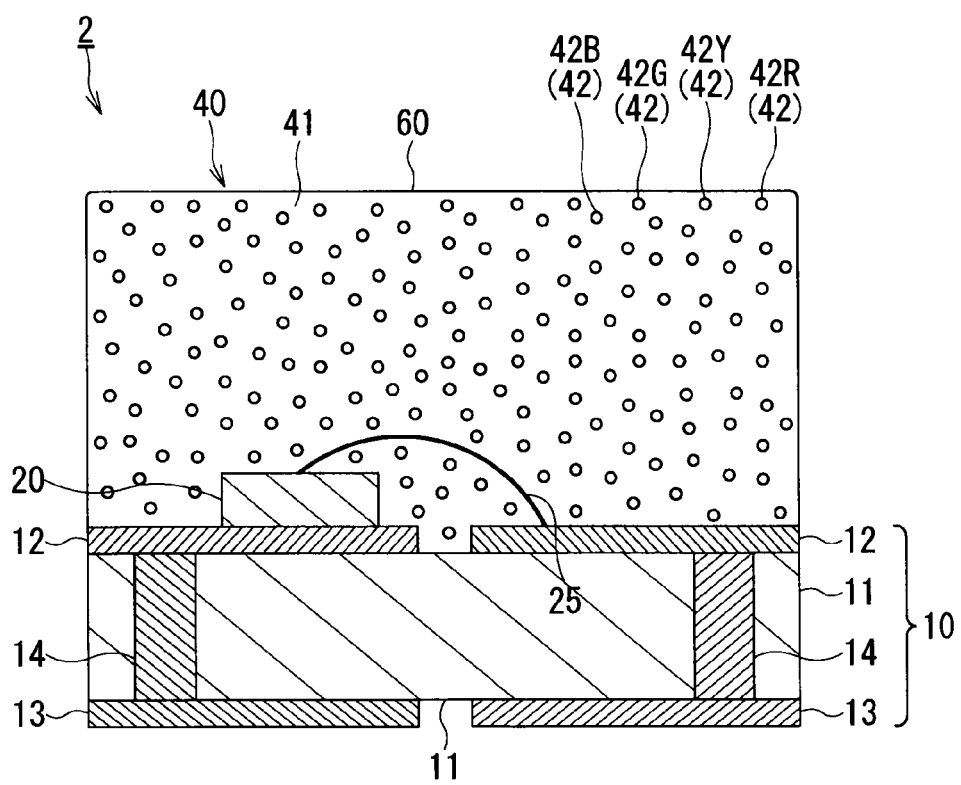
FIG. 4 is a cross sectional view schematically showing a structure of a white LED lamp according to Comparative Example 2.

FIG. 4 is a cross sectional view schematically showing a structure of thus obtained white LED lamp. The white LED lamp 2 shown in FIG. 4 has a structure in which the transparent resin layer formed in the white LED lamp 1 of the first embodiment shown in FIG. 1 is not formed. Other elements of the white LED lamp 2 shown in FIG. 4 are the same as those of the white LED lamp 1 shown in FIG. 1. Therefore, the same reference numerals are used to denote the same members or elements as those of the first embodiment, and the detailed explanations of these members or elements are simplified or omitted hereunder.

As shown in FIG. 4, the white LED lamp according to the above experimental sample (Comparative Example 2) has a structure in which a transparent resin layer is not formed, and the light emitting diode chip 20 and the bonding wire 25 are sealed by the phosphor layer 40.

[Evaluation of White LED Lamp]

(Evaluation of Emission Property of White LED Lamp)

With respect to thus manufactured white LED lamp, light emission properties were measured and evaluated as the same manner as in Example 1.

An outgoing light emitted from the white LED lamp had a light flux of 1.8 lm, and x value was 0.28 and y value was 0.23 in terms of the chromaticity (x, y) in XYZ color system of CIE.

As the same as in Example 1, the light outputted from the white LED lamp contained a residual primary light having an emission peak wavelength of 399 nm and a peak intensity of 0.1 mW/nm at a current of 30 mA.

Further, the light outputted from the white LED lamp contained a blue light having a peak wavelength of 445 nm and an emission peak intensity of 0.2 mW/nm at a current of 30 mA.

As the same manner as in Example 1, on the basis of the above data, the luminous efficiency of the white LED lamp, the energy of the residual primary light per total luminous flux, and the peak intensity ratio were calculated.

The luminous efficiency was calculated to be 18 lm/W. Further, the energy of the residual primary light per total luminous flux was calculated to be 0.41 mW/lm. Furthermore, the peak intensity ratio was calculated to be 0.5.

Furthermore, with respect to the white LED lamp, as the same manner as in Example 1, the thermal resistance Rth between the junction portion and the rear surface of the substrate was also calculated. The thermal resistance Rth was 40° C./W.

A part of the measured results are indicated in Table 2.

(Evaluation of Yellow Discoloration for Brightness Enhancement Film)

The same procedures as in Example 1 were repeated except that 18 pieces of thus obtained white LED lamps were used, thereby to evaluate the yellow-discoloration of the brightness enhancement film.

As a result, a yellow discoloration of the brightness enhancement film was observed after turning on the white LED lamps for 2000 hours, and the transmission factor after turning on the lamps for 2000 hours was 85% in comparison with the transmission factor of 100% at a time before turning on the lamps.

Ratios of the transmission factors after turning on the lamps for 2000 hours with respect to the transmission factors before turning on the lamps were indicated in Table 2.

In view of the above experimental sample (Comparative Example 2), the following fact was confirmed. Namely, in a case where the transparent resin layer was not formed, the luminous efficiency was disadvantageously lowered, and the brightness enhancement film caused the yellow discoloration.

In the structure in which the transparent resin layer is formed as in Example 1 or the like, the UV light—violet color light (primary light) emitted from the light emitting diode chip reaches the phosphor powder contained in the phosphor layer thereby to generate the secondary light. A part of the primary and secondary light is reflected at an interface between the transparent resin layer and the phosphor layer, and the reflected light is then entered into the light emitting diode chip or the light reflective electrodes.

The primary and secondary light entered into the light emitting diode chip is blocked within the light emitting diode chip because the reflection factor of the light emitting diode chip is large, and the entered light is hardly reflected. In contrast, the primary light incident into the light reflective electrode is reflected again toward a side of the phosphor layer. As explained above, in case of the white LED lamp formed with the transparent resin layer, a part of the reflected lights of the primary and the secondary lights are merely blocked within the light emitting diode chip.

In contrast to this, in case of the present experimental sample (Comparative Example 2), since the transparent resin layer is not formed, the phosphor layer is adjacent to the surface of light emitting diode chip. All of the primary and the second lights reflected at the interface between the light emitting diode chip and the phosphor layer is incident into the light emitting diode chip, and blocked therein. Therefore, it is supposed that the luminous efficiency was lowered in the present experimental sample.

In the present experimental sample, the yellow-discoloration was evaluated under the condition where the number of the white LED lamps was increased so as to secure a necessary amount of light flux which compensated for the lowered luminous efficiency of the white LED lamp.

In the present experimental sample, it was supposed that the power consumption and the generated heat amount were increased, so that the brightness enhancement film caused the yellow discoloration by the action of UV light and heat.

Example 3

Preparation of White LED Lamp

Using the white LED lamp obtained in Comparative Example 1, the following procedures of "preparation of UV light absorbing layer slurry" and "forming of UV light absorbing layer" were conducted thereby to manufacture a white LED lamp.

(Preparation of UV Light Absorbing Layer Slurry)

The same silicone resin as used in the formation of the transparent resin layer of Example 1, and ZnO fine particles having an average grain size of 10 nm were blended thereby to prepare a UV Light absorbing layer slurry containing 10 mass % of ZnO fine particles.

This UV light absorbing layer slurry was coated onto a surface of the phosphor layer of the white LED lamp obtained in Comparative Example 1. Then, the coated UV light absorbing layer slurry was heat-treated at a temperature of 140° C. for 10 minutes thereby to harden (cure) the mixed phosphor slurry. After the mixed phosphor slurry was hardened. As a result, there was obtained a white LED lamp having a rectangular-parallelepiped-shape, wherein the phosphor layer was covered with the UV light absorbing layer. The thickness of the UV light absorbing layer was 50 μm.

[Evaluation of White LED Lamp]
(Evaluation of Emission Property of white LED Lamp)

With respect to thus obtained white LED lamp, as the same manner as in Example 1, the light emission properties were measured and evaluated.

An outgoing light emitted from the white LED lamp had a light flux of 3.1 lm, and x value was 0.29 and y value was 0.23 in terms of the chromaticity (x, y) in XYZ color system of CIE.

As the same as in Example 1, the light outputted from the white LED lamp contained a residual primary light having an emission peak wavelength of 399 nm and a peak intensity of 0.061 mW/nm at a current of 30 mA.

Further, the light outputted from the white LED lamp contained a blue light having an emission peak wavelength of 445 nm and an emission peak intensity of 0.19 mW/nm at a current of 30 mA.

On the basis of the above data, as the same manner as in Example 1, the luminous efficiency of the white LED lamp, the energy of a residual primary light per total luminous flux, and the ratio of the emission peak intensity were calculated.

The luminous efficiency was calculated to be 31 lm/W. Further, the energy of the residual primary light per total luminous flux was calculated to be 0.25 mW/lm, and the peak intensity ratio was calculated to be 0.32.

Furthermore, with respect to the white LED lamp, as the same manner as in Example 1, the thermal resistance Rth between the junction portion and the rear surface of the substrate was also calculated. The thermal resistance Rth was 4° C./W.

A part of the measured results are indicated in Table 2.

(Evaluation of Yellow Discoloration for Brightness Enhancement Film)

The same procedures as in Example 1 were repeated except that 10 pieces of thus obtained white LED lamps were used, thereby to evaluate the yellow-discoloration of the brightness enhancement film.

As a result, the yellow discoloration of the brightness enhancement film was not substantially observed at all even after turning on the white LED lamps for 2000 hours, and the transmission factor after turning on the lamps for 2000 hours was 95% in comparison with the transmission factor of 100% at the time before turning on the lamps.

Ratios of the transmission factors after turning on the lamps for 2000 hours with respect to the transmission factors before turning on the lamps were indicated in Table 2.

Comparative Example 3

Preparation of White LED Lamp

The following procedures of "mounting of light emitting diode chip", "forming of transparent resin layer", "preparation of phosphor slurry" and "forming of phosphor layer" were conducted thereby to manufacture a white LED lamp.

(Mounting of Light Emitting Diode Chip and Forming of Transparent Resin Layer)

As the same manner as in Example 2, the light emitting diode chip was mounted and adhered onto the glass epoxy resin substrate. Thereafter, the light emitting diode chips and the bonding wires were sealed by the transparent resin, so that a transparent resin layer was formed.

(Preparation of Phosphor Slurry)

The same silicone resin as used in the formation of the transparent resin layer of Example 1, and the respective kinds of phosphor powders were blended at a predetermined ratio, thereby to prepare the respective phosphor slurries.

The phosphor slurry was prepared for each of B, Y, R phosphors of: a blue phosphor powder $((Sr_{0.42}Ba_{0.48}Ca_{0.01}Eu_{0.09})_{10}(PO_4)_6Cl_2)$ having an average grain sizes of 8 μm; a green phosphor powder $((Ba_{0.975}Sr_{0.01}Ca_{0.009}Eu_{0.06})(Mg_{0.7}Mn_{0.3})Al_{10}O_{17})$ having an average grain size of 8 μm; and a red phosphor powder $((La_{0.86}Eu_{0.14})_2O_2S)$ having an average grain size of 7 μm.

A blending ratio (mixing ratio) of the phosphor powder with respect to the silicone resin in the phosphor slurry was set to 80 mass % for each of the blue, green, and red phosphor powders.

Table 1 shows kinds of the phosphor powders used for preparing the respective phosphor slurries.

(Formation of Phosphor Layer)

The three kinds of the phosphor slurries for the respective B (blue), G (green), R (red) phosphor powders were mixed at a predetermined mixing ratio so that a chromaticity of a light emitted from the LED lamp exhibited a chromaticity (x=0.28, y=0.23) in an XYZ color system prescribed by CIE, thereby to prepare a mixed phosphor slurry. A mixing ratio of a total phosphor powders with respect to the silicone resin was set to 80 mass % which is the same value as those of the respective B, G, R phosphor slurries.

Next, Using this mixed phosphor slurry, the same procedures as in Example 1 were repeated except that each of thicknesses T1, T2, T3, T4 and T5 of the phosphor layer of the white LED lamp were set to 0.2 mm thereby to manufacture a white LED lamp.

[Evaluation of White LED Lamp]
(Evaluation of Emission Property of White LED Lamp)

With respect to thus manufactured white LED lamp, as the same manner as in Example 1, the light emission properties were measured and evaluated.

An outgoing light emitted from the white LED lamp had a light flux of 1 lm, and x value was 0.28 and y value was 0.23 in terms of the chromaticity (x, y) in XYZ color system of CIE.

As the same as in Example 1, the light outputted from the white LED lamp contained a residual primary light having an emission peak wavelength of 399 nm and a peak intensity of 0.032 mW/nm at a current of 30 mA.

Further, the light outputted from the white LED lamp contained a blue light having an emission peak wavelength of 452 nm and an emission peak intensity of 0.07 mW/nm at a current of 30 mA.

On the basis of the above data, as the same manner as in Example 1, a luminous efficiency of the white LED lamp, energy of a residual primary light per total luminous flux, and a ratio of an emission peak intensity were calculated.

The luminous efficiency was calculated to be 10 lm. Further, the energy of the residual primary light per total luminous flux was calculated to be 0.42 mW/lm, and the peak intensity ratio was calculated to be 0.46.

Furthermore, with respect to the white LED lamp, as the same manner as in Example 1, a thermal resistance Rth between the junction portion and the rear surface of the substrate was also calculated. As a result, the thermal resistance Rth was 40° C./W.

A part of the measured results are indicated in Table 2.

(Evaluation of Yellow Discoloration for Brightness Enhancement Film)

The same procedures as in Example 1 were repeated except that 32 pieces of thus obtained white LED lamps were used, thereby to evaluate the yellow-discoloration of the brightness enhancement film.

As a result, a yellow discoloration of the brightness enhancement film was observed after turning on the white LED lamps for 2000 hours, and the transmission factor after turning on the lamps for 2000 hours was 85% in comparison with the transmission factor of 100% at a time before turning on the lamps.

Ratios of the transmission factors after turning on the lamps for 2000 hours with respect to the transmission factors before turning on the lamps were indicated in Table 2.

In view of the above experimental sample (Comparative Example 3), the following fact was confirmed. Namely, in a case where the average grain size of the phosphor powder was small, the luminous efficiency was disadvantageously lowered and the brightness enhancement film caused the yellow discoloration.

Next, an embodiment of the display device of the present invention in which thus prepared white LED is used as a backlight will be explained more concretely with reference to the following Examples and Comparative Examples.

Examples 101-124 and Comparative Examples 101-124

There were prepared the respective blue (B), green (G) and red (R) phosphors each having the following compositions for forming phosphor layers of the display devices according to Examples and Comparative Examples.

Example 101

Blue phosphor: $(Sr_{0.99}Eu_{0.01})_5(PO_4)_3Cl$
Green phosphor: $(Ba_{0.8}Eu_{0.2})(Mg_{0.7}Mn_{0.3})Al_{10}O_{17}$
Red phosphor: $(La_{0.899}Eu_{0.1}Sm_{0.001})_2O_2S$ Comparative Example 101

Blue phosphor: $(Sr_{0.99}Eu_{0.01})_{10}(PO_4)_6Cl_2 0.24B_2O_3$
Green phosphor: $BaMgAl_{10}O_{17}:Eu_{0.2}, Mn_{0.2}$
Red phosphor: $LaO_2S:Eu_{0.099}, Sm_{0.001}$ Example 102

Blue phosphor: $(Sr_{0.8}Ba_{0.19}Eu_{0.01})_5(PO_4)_3Cl$
Green phosphor: $(Ba_{0.8}Eu_{0.2})(Mg_{0.7}Mn_{0.3})Al_{10}O_{17}$
Red phosphor: $(La_{0.899}Eu_{0.1}Sm_{0.001})_2O_2S$ Comparative Example 102

Blue phosphor: $(Sr_{0.81}Ba_{0.19})_5(PO_4)_3Cl:Eu_{0.01}$
Green phosphor: $BaMgAl_{10}O_{17}:Eu_{0.2}, Mn_{0.2}$
Red phosphor: $LaO_2S:Eu_{0.098}, Sm_{0.001}, Bi_{0.001}$ Example 103

Blue phosphor: $(Sr_{0.8}Ca_{0.19}Eu_{0.01})_5(PO_4)_3Cl$
Green phosphor: $(Ba_{0.8}Eu_{0.2})(Mg_{0.7}Mn_{0.3})Al_{10}O_{17}$
Red phosphor: $(La_{0.899}Eu_{0.1}Sm_{0.001})_2O_2S$ Comparative Example 103

Blue phosphor: $(Sr_{0.8}Ca_{0.19}Eu_{0.01})_{10}(PO_4)_6Cl_2 0.24B_2O_3$
Green phosphor: $BaMgAl_{10}O_{17}: Eu_{0.2}, Mn_{0.2}$
Red phosphor: $LaO_2S: Eu_{0.098}, Ce_{0.001}, Bi_{0.001}$ Example 104

Blue phosphor: $(Sr_{0.8}Ca_{0.19}Eu_{0.01})_5(PO_4)_3Cl$
Green phosphor: $(Sr_{1.15}Ba_{0.7}Mg_{0.048}Mn_{0.002}Eu_{0.1})SiO_4$
Red phosphor: $(La_{0.899}Eu_{0.1}Sm_{0.001})_2O_2S$ Comparative Example 104

Blue phosphor: $(Sr_{0.8}Ca_{0.19}Eu_{0.01})_{10}(PO_4)_6Cl_2 0.24B_2O_3$
Green phosphor: $(Sr_{0.575}Ba_{0.35}Mg_{0.024})_2SiO_4:Mn_{0.002}, Eu_{0.1}$
Red phosphor: $LaO_2S:Eu_{0.097}, Sm_{0.001}, Ce_{0.001}, Bi_{0.001}$ Example 105

Blue phosphor: $(Sr_{0.8}Ca_{0.19}Eu_{0.01})_5(PO_4)_3Cl$
Green phosphor: $(Sr_{1.15}Ba_{0.7}Mg_{0.048}Mn_{0.002}Eu_{0.1})SiO_4$
Red phosphor: $(La_{0.898}Eu_{0.1}Sm_{0.002})_2O_2S$ Comparative Example 105

Blue phosphor: $(Sr_{0.8}Ca_{0.19}Eu_{0.01})_{10}(PO_4)_6Cl_2 0.24B_2O_3$
Green phosphor: $(Sr_{0.575}Ba_{0.35}Mg_{0.023})_2SiO_4:Mn_{0.002}, Eu_{0.1}, Ti_{0.002}$
Red phosphor: $LaO_2S:Eu_{0.096}, Sm_{0.002}, Ce_{0.001}, Bi_{0.001}$ Example 106

Blue phosphor: $(Sr_{0.98}Eu_{0.02})_5(PO_4)_3Cl$
Green phosphor: $(Sr_{1.15}Ba_{0.7}Mg_{0.048}Mn_{0.002}Eu_{0.1})SiO_4$
Red phosphor: $(La_{0.898}Eu_{0.1}Sm_{0.002})_2O_2S$ Comparative Example 106

Blue phosphor: $(Sr_{0.98}Eu_{0.02})_{10}(PO_4)_6Cl_2 0.24B_2O_3$
Green phosphor: $(Sr_{0.575}Ba_{0.35}Mg_{0.023})_2SiO_4:Mn_{0.002}, Eu_{0.01}, Pr_{0.002}$
Red phosphor: $LaO_2S: Eu_{0.096}, Sm_{0.002}, Ce_{0.001}, Bi_{0.001}$ Example 107

Blue phosphor: $(Sr_{0.8}Ca_{0.19}Eu_{0.01})_5(PO_4)_3Cl$
Green phosphor: $(Sr_{1.15}Ba_{0.7}Mg_{0.048}Mn_{0.002}Eu_{0.1})SiO_4$
Red phosphor: $(La_{0.898}Eu_{0.1}Sm_{0.002})_2O_2S$ Comparative Example 107

Blue phosphor: $(Sr_{0.8}Ca_{0.12}Mg_{0.01})_5(PO_4)_3Cl_3:Eu$
Green phosphor: $(Sr_{0.575}Ba_{0.35}Mg_{0.023})_2SiO_4:Mn_{0.002}, Eu_{0.1}Pr_{0.002}Pb_{0.002}$
Red phosphor: $LaO_2S:Eu_{0.096}, Sm_{0.002}, Bi_{0.002}$ Example 108

Blue phosphor: $(Sr_{0.98}Eu_{0.02})_5(PO_4)_3Cl$
Green phosphor: $LaO_2S:Eu_{0.097}, Sm_{0.001}$ Red phosphor: $(La_{0.899}Eu_{0.1}Sm_{0.001})_2O_2S$ Comparative Example 108

Blue phosphor: $(Sr_{0.98}Eu_{0.02})_{10}(PO_4)_6Cl_2 0.24B_2O_3$
Green phosphor: $(Sr_{0.575}Ba_{0.35}Mg_{0.023})_2SiO_4:Mn_{0.002}, Eu_{0.1}Li_{0.002}$
Red phosphor: $LaO_2S:Eu_{0.097}, Sm_{0.001}, Ce_{0.001}, Bi_{0.001}$ Example 109

Blue phosphor: $(Sr_{0.8}Ca_{0.19}Eu_{0.01})_5(PO_4)_3Cl$
Green phosphor: $(Sr_{1.13}Ba_{0.72}Mg_{0.048}Mn_{0.002}Eu_{0.1})SiO_4$
Red phosphor: $(La_{0.899}Eu_{0.1}Sm_{0.002})_2O_2S$

Comparative Example 109

Blue phosphor: $(Sr_{0.8}Ca_{0.19}Eu_{0.01})_{10}(PO_4)_6Cl_2 0.24B_2O_3$
Green phosphor: $(Sr_{0.575}Ba_{0.35}Mg_{0.023})_2SiO_4:Mn_{0.002}, Eu_{0.1}Ce_{0.002}$
Red phosphor: $LaO_2S:Eu_{0.097}, Sm_{0.001}, Ce_{0.001}, Bi_{0.001}$

Example 110

Blue phosphor: $(Sr_{0.8}Ca_{0.19}Eu_{0.01})_5(PO_4)_3Cl$
Green phosphor: $(Sr_{0.995}Ba_{0.8}Mg_{0.1}Mn_{0.005}Eu_{0.1})SiO_4$
Red phosphor: $(La_{0.899}Eu_{0.1}Sm_{0.002})_2O_2S$

Comparative Example 110

Blue phosphor: $(Sr_{0.8}Ca_{0.19}Eu_{0.01})_{10}(PO_4)_6Cl_2 0.24B_2O_3$
Green phosphor::$(Sr_{0.575}Ba_{0.35}Mg_{0.023})_2SiO_4:Mn_{0.002}, Eu_{0.1}Sn_{0.002}$
Red phosphor: $LaO_2S:Eu_{0.099}, Sm_{0.001}$

Example 111

Blue phosphor: $(Sr_{0.8}Ca_{0.19}Eu_{0.01})_5(PO_4)_3Cl$
Green phosphor: $(Sr_{1.15}Ba_{0.7}Mg_{0.048}Mn_{0.002}Eu_{0.1})SiO_4$
Red phosphor: $(La_{0.098}Eu_{0.1}Sm_{0.002})_2O_2S$

Comparative Example 111

Blue phosphor: $(Sr_{0.8}Ca_{0.19}Eu_{0.01})_{10}(PO_4)_6Cl_2 0.24B_2O_3$
Green phosphor: $(Sr_{0575}Ba_{0.374})_2SiO_4:Mn_{0.002}, Eu_{0.1}$
Red phosphor: $LaO_2S:Eu_{0.097}, Sm_{0.002}, Bi_{0.001}$

Example 112

Blue phosphor: $(Sr_{0.8}Ba_{0.19}Eu_{0.01})_5(PO_4)_3Cl$
Green phosphor: $(Sr_{1.15}Ba_{0.7}Mg_{0.048}Mn_{0.002}Eu_{0.1})SiO_4$
Red phosphor: $(La_{0.898}Eu_{0.1}Sm_{0.002})_2O_2S$

Comparative Example 112

Blue phosphor: $(Sr_{0.81}Ca_{0.19})_{10}(PO_4)_6Cl_2:Eu$
Green phosphor: $(Sr_{055}Ba_{0.35})SiO_4:Eu_{0.1}$
Red phosphor: $LaO_2S: Eu_{0.097}, Sm_{0.001}, Ce_{0.001}, Bi_{0.001}$

Example 113

Blue phosphor: $(Sr_{0.99}Eu_{0.01})_5(PO_4)_3Cl$
Green phosphor: $(Sr_{1.15}Ba_{0.7}Mg_{0.048}Mn_{0.002}Eu_{0.1}) SiO_4$
Red phosphor: $(La_{0.898}Eu_{0.1}Sm_{0.002})_2O_2S$

Comparative Example 113

Blue phosphor: $(Sr_{0.8}Ca_{0.19})_5(PO_4)_3Cl:Eu_{0.05}$
Green phosphor: $(Sr_{055}Ba_{0.35})SiO_4:Eu_{0.1}$
Red phosphor: $LaO_2S:Eu_{0.1}, Sm_{0.002}$

Example 114

Blue phosphor: $(Sr_{0.8}Ba_{0.19}Eu_{0.01})_5(PO_4)_3Cl$
Green phosphor: $(Sr_{1.15}Ba_{0.7}Mg_{0.048}Mn_{0.002}Eu_{0.1})SiO_4$
Red phosphor: $(La_{0.898}Eu_{0.1}Sm_{0.002})_2O_2S$

Comparative Example 114

Blue phosphor: $(Sr_{0.8}Ba_{0.19})_5(PO_4)_3Cl:Eu_{0.05}$
Green phosphor: $(Sr_{0575}Ba_{0.35}Zn_{0.374})_2SiO_4: Mn_{0.002}, Eu_{0.1}$
Red phosphor: $LaO_2S: Eu_{0.1}, Sm_{0.002}, Bi_{0.001}$

Example 115

Blue phosphor: $(Sr_{0.8}Ca_{0.19}Eu_{0.01})_5(PO_4)_3Cl$
Green phosphor: $(Sr_{0.97}Eu_{0.03})Ga_2S_4$
Red phosphor: $(La_{0.898}Eu_{0.1}Sm_{0.002})_2O_2S$

Comparative Example 115

Blue phosphor: $(Sr_{0.8}Ca_{0.19}Eu_{0.01})_{10}(PO_4)_6Cl_2 0.24B_2O_3$
Green phosphor: $SrGa_2S_4:Eu_{0.03}, Mn_{0.002}$
Red phosphor: $LaO_2S: Eu_{0097}, Sm_{0.002}, Bi_{0.001}$

Example 116

Blue phosphor: $(Sr_{0.8}Ca_{0.19}Eu_{0.01})_5(PO_4)_3Cl$
Green phosphor: $(Sr_{1.15}Ba_{0.7}Mg_{0.048}Mn_{0.002}Eu_{0.1})SiO_4$
Red phosphor: $Ca_{0.99}Eu_{0.01}AlSiN_3$

Comparative Example 116

Blue phosphor: $(Sr_{0.8}Ca_{0.19}Eu_{0.01})_{10}(PO_4)_6Cl_2 0.24B_2O_3$
Green phosphor: $(Sr_{0575}Ba_{0.35}Mg_{0.023})_2SiO_4: Mn_{0.002}, Eu_{0.1}, Ti_{0.002}$
Red phosphor: $CaAlSiN_3:Eu_{0.01}$

Example 117

Blue phosphor: $(Ba_{0.99}Eu_{0.01})MgAl_{10}O_{17}$
Green phosphor: $(Sr_{1.15}Ba_{0.7}Mg_{0.048}Mn_{0.002}Eu_{0.1})SiO_4$
Red phosphor: $(La_{0.898}Eu_{0.1}Sm_{0.002})_2O_2S$

Comparative Example 117

Blue phosphor: $(Ba, Mg) Al_{10}O_{17}:Eu_{0.01}, Mn_{0.01}$
Green phosphor: $(Sr_{0575}Ba_{0.35}Mg_{0.023})_2SiO_4:Mn_{0.002}, Eu_{0.1}Ce_{0.002}$
Red phosphor: $LaO_2S: Eu_{0096}, Sm_{0.002}, Ce_{0.001}, Bi_{0.001}$

Example 118

Blue phosphor: $(Ba_{0.97}Eu_{0.03})MgAl_{10}O_{17}$
Green phosphor: $(Sr_{1.15}Ba_{0.7}Mg_{0.048}Mn_{0.002}Eu_{0.1})SiO_4$
Red phosphor: $(La_{0.898}Eu_{0.1}Sm_{0.002})_2O_2S$

Comparative Example 118

Blue phosphor: $(Ba, Mg) Al_{10}O_{17}:Eu_{0.03}, Mn_{0.01}$
Green phosphor: $(Sr_{0575}Ba_{0.35}Mg_{0.024})_2SiO_4:Mn_{0.002}, Eu_{0.1}$
Red phosphor: $LaO_2S: Eu_{0097}, Sm_{0.002}, Ce_{0.001}$

Example 119

Blue phosphor: $(Ba_{0.99}Eu_{0.01})MgAl_{10}O_{17}$
Green phosphor: $(Sr_{1.15}Ba_{0.7}Mg_{0.048}Mn_{0.002}Eu_{0.1})SiO_4$
Red phosphor: $(La_{0.898}Eu_{0.1}Sm_{0.002})_2O_2S$

Comparative Example 119

Blue phosphor: $BaMg_2Al_{16}O_{27}:Eu_{0.01}$
Green phosphor: $(Sr_{055}Ba_{0.35})SiO_4:Eu_{0.1}$
Red phosphor: $LaO_2S:Eu_{0096}, Sm_{0.002}, Ce_{0.001}$

Example 120

Blue phosphor: $(Sr_{0.8}Ca_{0.19}Eu_{0.01})_5(PO_4)_3Cl$
Green phosphor: $(Sr_{1.15}Ba_{0.7}Mg_{0.048}Mn_{0.002}Eu_{0.1})SiO_4$
Red phosphor: $(La_{0.898}Eu_{0.1}Sm_{0.002})_2O_2S$

Comparative Example 120

Blue phosphor: $(Sr_{0.8}Ca_{0.19}Eu_{0.01})_{10}(PO_4)_6Cl_2 0.24B_2O_3$
Green phosphor: $(Sr_{055}Ba_{0.349})SiO_4:Eu_{0.1}, Ce_{0.01}$
Red phosphor: $LaO_2S:Eu_{0097}, Sm_{0.002}, Bi_{0.001}$

Example 121

Blue phosphor: $(Sr_{2.55}Eu_{0.25})Mg_{1.25}Si_2O_8$
Green phosphor: $(Sr_{1.15}Ba_{0.7}Mg_{0.048}Mn_{0.002}, Eu_{0.1})SiO_4$
Red phosphor: $Sr_{0.1}Ca_{0.89}Eu_{0.01}AlSN_3$

Comparative Example 121

Blue phosphor: $(Sr_{0.8}Ca_{0.19}Eu_{0.01})_{10}(PO_4)_6Cl_2 0.24B_2O_3$
Green phosphor: $(Sr_{055}Ba_{0.348})SiO_4:Eu_{0.1}, Ce_{0.02}$
Red phosphor: $CaAlSiN_3:Eu_{0.01}$

Example 122

Blue phosphor: $(BaSr_{1.55}Eu_{0.25})Mg_{1.1}Si_2O_8$
Green phosphor: $(Sr_{1.15}Ba_{0.7}Mg_{0.047}Mn_{0.003}, Eu_{0.1})SiO_4$
Red phosphor: $Sr_{0.085}Ca_{0.9}Eu_{0.015}AlSiN_3$

Comparative Example 122

Blue phosphor: $(Sr_{0.8}Ca_{0.19}Eu_{0.01})_{10}(PO_4)_6Cl_2 0.24B_2O_3$
Green phosphor: $(Sr_{055}Ba_{0.349})SiO_4:Eu_{0.1}, Ce_{0.01}$
Red phosphor: $CaAlSiN_3:Eu_{0.015}$

Example 123

Blue phosphor: $(Ba_{0.99}Eu_{0.01})MgAl_{10}O_{17}$
Green phosphor: $(Sr_{1.15}Ba_{0.7}Mg_{0.048}Mn_{0.002}Eu_{0.1})SiO_4$
Red phosphor: $(La_{0.898}Eu_{0.1}Sm_{0.002})_2O_2S$ - - - 70%
$(Sr_{1.688}Ca_{0.2}Mg_{0.01}Eu_{0.1}Mn_{0.002})SiO_4$ - - - 30%

Comparative Example 123

Blue phosphor: $BaMg_2Al_{16}O_{27}:Eu_{0.01}$
Green phosphor: $(Sr_{055}Ba_{0.35})SiO_4:Eu_{0.1}$
Red phosphor: $LaO_2S: Eu_{0098}, Sm_{0.002}, Ce_{0.001}, Bi_{0.001}$

Example 124

Blue phosphor: $(Sr_{0.8}Ca_{0.19}Eu_{0.01})_5(PO_4)_3Cl$
Green phosphor: $(Sr_{1.15}Ba_{0.7}Mg_{0.048}Mn_{0.002}Eu_{0.1})SiO_4$
Red phosphor: $(La_{0.898}Eu_{0.1}Sm_{0.002})_2O_2S$ - - - 70%
$(Ba_{2.75}Sr_{0.05}Eu_{0.1}Mn_{0.1})MgSi_2O_8$ - - - 30%

Comparative Example 124

Blue phosphor: $(Sr_{0.8}Ca_{0.19}Eu_{0.01})_{10}(PO_4)_6Cl_2 0.24B_2O_3$
Green phosphor: $(Sr_{055}Ba_{0.349})SiO_4:Eu_{0.1}, Ce_{0.01}$
Red phosphor: $LaO_2S:Eu_{0097}, Sm_{0.002}, Bi_{0.001}$ Next, thus prepared respective blue (B), green (G) and red (R) phosphors for each of Examples and Comparative Examples were dispersed into transparent resin liquids, and ultraviolet-hardening resin was also added and mixed into the transparent resin liquids thereby to prepare phosphor slurries for the respective colors.

Glass plates each having a size of A4 were prepared, and a blue phosphor slurry was screen-printed in a form of stripe having a width of about 100 μm onto the glass plate. In order to increase a bonding strength between the stripe and the glass plate, a hardening treatment using an ultraviolet light was performed. With respect to a green phosphor slurry and a red phosphor slurry, the same printing process was applied, so that stripes each having a width of about 100 μm were formed, thereby to obtain a phosphor screen having a phosphor layer 108 as shown in FIG. 8. Then, this phosphor screen was assembled into a laser light exciting system (UV light generating source) 109, thereby to prepare the display devices of the respective Examples and Comparative Examples.

When performances of thus prepared display devices are evaluated, it is important to evaluate a brightness (luminosity) and a color reproduction range. Namely, when the light image is displayed on the display device with the same white chromaticity, a higher brightness is more preferable. Further, when a broader ratio of the color reproduction range with respect to an international standard (NTSC) indicating an ideal triangular color reproduction range is obtained, it can be said that the display device can display more lights having various chromaticity, and the liquid crystal display device or the like has a more excellent color reproducing property.

An extent of the color reproduction range is usually expressed as a relative value (%) obtained by calculating an area of a triangular region specifying by connecting the reproduced B, G, R color points in the chromaticity diagram when the area of a triangular region specified by NTSC is assumed to be 100%.

With respect to each of the above display devices of Examples 101-124 and Comparative Examples 101-124, the brightness at a center of the phosphor screen and a ratio (%) of the color reproduction range with respect to the NTSC (100%) were measured, and the results shown in the accompanying Table 4 were obtained.

As is clear from the result shown in Table 4, according to the respective display devices of Examples, both the brightness and NTSC ratio (color reproduction range ratio) are high, so that it is confirmed that the display devices of Examples have excellent light emitting performances in comparison with the conventional display devices using conventional phosphors each having a conventional composition.

Next, an embodiment of the illumination device according to the present invention will be explained more concretely with reference to the following Examples and Comparative Examples.

Examples 201-210 and Comparative Example 201

There were prepared the respective blue (B), green (G) and red (R) phosphors each having the following compositions for forming phosphor layers of the illumination devices according to the respective Examples and Comparative Example.

Example 201

Blue phosphor: $(Sr_{0.99}Eu_{0.01})_5(PO_4)_3Cl$
Green phosphor: $(Ba_{0.8}Eu_{02}) (Mg_{0.7}Mn_{0.3})Al_{10}O_{17}$
Red phosphor: $(La_{0.899}Eu_{0.1}Sm_{0.001})_2O_2S$

Example 202

Blue phosphor: $(Sr_{0.8}Eu_{0.01})_5(PO_4)_3Cl$
Green phosphor: $(Ba_{0.8}Eu_{02}) (Mg_{0.7}Mn_{0.3})Al_{10}O_{17}$
Red phosphor: $(La_{0.899}Eu_{0.1}Sm_{0.001})_2O_2S$

Example 203

Blue phosphor: $(Sr_{0.8}Ca_{0.19}Eu_{0.01})_5(PO_4)_3Cl$
Green phosphor: $(Ba_{0.8}Eu_{02}) (Mg_{0.7}Mn_{0.3})Al_{10}O_{17}$
Red phosphor: $(La_{0.899}Eu_{0.1}Sm_{0.001})_2O_2S$

Example 204

Blue phosphor: $(Sr_{0.8}Ca_{0.19}Eu_{0.01})_5(PO_4)_3Cl$
Green phosphor: $(Sr_{1.15}Ba_{0.7}Mg_{0.048}Mn_{0.002}Eu_{0.1})SiO_4$
Red phosphor: $(La_{0.899}Eu_{0.1}Sm_{0.001})_2O_2S$

Example 205

Blue phosphor: $(Sr_{0.8}Ca_{0.19}Eu_{0.01})_5(PO_4)_3Cl$
Green phosphor: $(Sr_{1.15}Ba_{0.7}Mg_{0.048}Mn_{0.002}Eu_{0.1})SiO_4$
Red phosphor: $(La_{0.898}Eu_{0.1}Sm_{0.002})_2O_2S$

Example 206

Blue phosphor: $(Sr_{0.98}Eu_{0.02})_5(PO_4)_3Cl$
Green phosphor: $(Sr_{1.15}Ba_{0.7}Mg_{0.048}Mn_{0.002}Eu_{0.1})SiO_4$
Red phosphor: $(La_{0.898}Eu_{0.1}Sm_{0.002})_2O_2S$

Example 207

Blue phosphor: $(Sr_{0.8}Ca_{0.19}Eu_{0.01})_5(PO_4)_3Cl$
Green phosphor: $(Sr_{1.15}Ba_{0.7}Mg_{0.048}Mn_{0.002}Eu_{0.1})SiO_4$
Red phosphor: $(La_{0.898}Eu_{0.1}Sm_{0.002})_2O_2S$

Example 208

Blue phosphor: $(Sr_{0.98}Eu_{0.02})_5(PO_4)_3Cl$
Green phosphor: $(Sr_{1.15}Ba_{0.7}Mg_{0.048}Mn_{0.002}Eu_{0.1})SiO_4$
Red phosphor: $(La_{0.899}Eu_{0.1}Sm_{0.001})_2O_2S$
Red phosphor: $LaO_2S:Eu_{0.097}, Sm_{0.001}, Ce_{0.001}, Bi_{0.001}$

Example 209

Blue phosphor: $(Sr_{0.8}Ca_{0.19}Eu_{0.01})_5(PO_4)_3Cl$
Green phosphor: $(Sr_{1.13}Ba_{0.72}Mg_{0.048}Mn_{0.002}Eu_{0.1})SiO_4$
Red phosphor: $(La_{0.898}Eu_{0.1}Sm_{0.002})_2O_2S$

Example 210

Blue phosphor: $(Sr_{0.8}Ca_{0.19}Eu_{0.01})_5(PO_4)_3Cl$
Green phosphor: $(Sr_{0.995}Ba_{0.8}Mg_{0.1}Mn_{0.005}Eu_{0.1})SiO_4$
Red phosphor: $(La_{0.899}Eu_{0.1}Sm_{0.001})_2O_2S$ Next, thus prepared blue, green and red (B, G, R) phosphor powders were mixed at a predetermined mixing ratio so that a chromaticity (x, y) of a light emitted from the LED lamp exhibited a chromaticity (x=0.275±0.003, y=0.250±0.003) in the XYZ color system prescribed by CIE (International Commission on Illumination), thereby to prepare a mixed phosphor powder. Then, the mixed phosphor powder was dispersed into the silicone resin thereby to prepare a phosphor slurry. Further, a quartz glass tube having an outer diameter of 10 mm and a length of 200 mm was prepared and then, the phosphor slurry was coated onto an inner surface of the quartz glass tube, followed by hardening the coated phosphor slurry, thereby to form a predetermined phosphor film as shown in FIG. 9.

Further, one end of the quartz glass tube was sealed by a metal plate subjected to silver (Ag) plating. Then, fine silica powder (average grain size: 10 μm) dispersed in the silicone resin was poured in the quartz glass tube. A silver (Ag)-plated plate formed with a small hole at a center thereof was prepared, and the silver-plated plate was attached to another end of the quartz glass tube. Under this condition, the quartz glass tube was heated to a temperature of 150° C., thereby to harden the silicone resin.

Furthermore, as shown in FIG. 9, a laser diode 205 was attached to the silver-plated plate so as to allow a laser light having a peak wavelength of 405 nm to radiate through the small hole, thereby to manufacture cylindrical-type laser illumination devices of the respective Examples.

With respect to the illumination devices of the respective Examples manufactured by changing the combination of the B, G, R phosphors, the luminous efficiency and the color reproduction range (NTSC ratio) were comparatively measured thereby to obtain the results shown in accompanying Table 5.

In this connection, as Comparative Example 201, the luminous efficiency and the color reproduction range (NTSC ratio) were also measured with respect to a conventional CCFL tube (cold cathode fluorescent lamp tube) in which a laser diode was not used as an exciting light source and mercury vapor was enclosed therein. The conventional cold cathode fluorescent lamp (CCFL) was operated under the same electrical power level as those of Examples.

As is clear from the result shown in Table 5, according to the laser illumination devices of the respective Examples, it was confirmed that there could be simultaneously realized both the luminous efficiency and the color reproduction range (NTSC ratio) that are equal to or more excellent than those of the conventional CCFL tube (cold cathode fluorescent lamp tube) into which the mercury vapor was enclosed.

In addition, unlike the conventional CCFL tube, the present invention does not use harmful mercury as an enclosing component into the tube, so that the problem of polluting environment would not occur, thus being extremely useful for the practical use.

TABLE 1

| | | Thickness of Transparent Resin Layer (mm) | Phosphor Layer | | | | |
|---|---|---|---|---|---|---|---|
| | | | Blue Phosphor Powder | | Green Phosphor Powder | | Yellow Phosphor Powder |
| Sample No. | Substrate | | Composition | Average Grain Size (μm) | Composition | Average Grain Size (μm) | Composition |
| Example 1 | AlN | 0.2 | $(Sr_{0.894}Ba_{0.1}Eu_{0.006})_{10}(PO_4)_6 \cdot Cl_2$ | 10 | $(Ba_{0.32}Sr_{0.19}Ca_{0.01}Eu_{0.48})(Mg_{0.89}Mn_{0.11})Al_{10}O_{17}$ | 11 | None |
| Reference Example 1 | — | — | — | — | — | — | — |
| Example 2 | Glass Epoxy | 0.3 | $(Sr_{0.42}Ba_{0.48}Ca_{0.01}Eu_{0.09})_{10}(PO_4)_6 \cdot Cl_2$ | 12 | $(Ba_{0.975}Sr_{0.01}Ca_{0.009}Eu_{0.006})(Mg_{0.51}Mn_{0.49})Al_{10}O_{17}$ | 22 | $ZnS:Au_{0.0002}Al_{0.0002}$ |
| Example 3 | Resin Package | 0.4 | $(Sr_{0.85}Ba_{0.01}Ca_{0.09}Eu_{0.05})_{10}(PO_4)_6 \cdot Cl_2$ | 20 | $(Ba_{0.799}Sr_{0.1}Ca_{0.001}Eu_{0.1})(Mg_{0.7}Mn_{0.3})Al_{10}O_{17}$ | 25 | None |
| Example 4 | Alumina | 0.2 | $(Sr_{0.44}Ba_{0.49}Ca_{0.02}Eu_{0.05})_{10}(PO_4)_6 \cdot Cl_2$ | 40 | None | — | $(Sr_{1.58}Ba_{0.11}Mg_{0.2}Eu_{0.1}Mn_{0.01})SiO_4$ |
| Comparative Example 1 | Resin Package | 0.2 | $(Sr_{0.85}Ba_{0.01}Ca_{0.09}Eu_{0.05})_{10}(PO_4)_6 \cdot Cl_2$ | 20 | $(Ba_{0.799}Sr_{0.1}Ca_{0.001}Eu_{0.1})(Mg_{0.7}Mn_{0.3})Al_{10}O_{17}$ | 25 | None |

TABLE 1-continued

| | | | | | | | |
|---|---|---|---|---|---|---|---|
| Comparative Example 2 | Glass Epoxy | None | $(Sr_{0.85}Ba_{0.01}Ca_{0.09}Eu_{0.05})_{10}(PO_4)_6 \cdot Cl_2$ | 20 | $(Ba_{0.799}Sr_{0.1}Ca_{0.001}Eu_{0.1})(Mg_{0.7}Mn_{0.3})Al_{10}O_{17}$ | 25 | None |
| Example 5 | Resin Package | 0.2 | $(Sr_{0.85}Ba_{0.01}Ca_{0.09}Eu_{0.05})_{10}(PO_4)_6 \cdot Cl_2$ | 20 | $(Ba_{0.799}Sr_{0.1}Ca_{0.001}Eu_{0.1})(Mg_{0.7}Mn_{0.3})Al_{10}O_{17}$ | 25 | None |
| Comparative Example 3 | Glass Epoxy | 0.3 | $(Sr_{0.42}Ba_{0.48}Ca_{0.01}Eu_{0.09})_{10}(PO_4)_6 \cdot Cl_2$ | 8 | $(Ba_{0.975}Sr_{0.01}Ca_{0.009}Eu_{0.006})(Mg_{0.7}Mn_{0.3})Al_{10}O_{17}$ | 8 | None |

| | Phosphor Layer | | | | | | |
|---|---|---|---|---|---|---|---|
| | Yellow Phosphor Powder | Red Phosphor Powder | | Total Phosphor Content in | Thickness of | Thickness of | |
| Sample No. | Average Grain Size (μm) | Composition | Average Grain Size (μm) | Phosphor Layer (wt %) | Phosphor Layer (mm) | UV Absorbing Layer (μm) | Notes |
| Example 1 | — | $(La_{0.98}Eu_{0.02})_2O_2S$ | 10 | 80 | 0.1 | None | |
| Reference Example 1 | — | — | — | — | — | — | CCFL |
| Example 2 | 22 | $(Sr_{0.39}Ca_{0.61})SiAlN_3:Eu$ | 18 | 80 | 0.2 | None | |
| Example 3 | — | $(Sr_{0.01}Ca_{0.99})SiAlN_3:Eu$ | 25 | 40 | 0.2 | None | |
| Example 4 | 30 | $(La_{0.859}Eu_{0.14}Ga_{0.001})_2O_2S$ | 40 | 70 | 0.7 | None | |
| Comparative Example 1 | — | $(Sr_{0.01}Ca_{0.99})SiAlN_3:Eu$ | 25 | 40 | 0.09 | None | |
| Comparative Example 2 | — | $(Sr_{0.01}Ca_{0.99})SiAlN_3:Eu$ | 25 | 40 | 0.2 | None | |
| Example 5 | — | $(Sr_{0.01}Ca_{0.99})SiAlN_3:Eu$ | 25 | 40 | 0.09 | 50 | |
| Comparative Example 3 | — | $(La_{0.86}Eu_{0.14})_2O_2S$ | 7 | 80 | 0.2 | None | |

TABLE 2

| Sample No. | Light Flux lm | Luminous Efficiency lm/W | Color (Chromatisity) of Outgoing Light x | Color (Chromatisity) of Outgoing Light y | Energy of Light having Wavelength of 360-410 nm per Total Light Flux mW/lm | Peak Intensity of Primary Light at Current of 30 mA a mW/nm | Peak Intensity of Blue Light at Current of 30 mA b mW/nm | Peak Intensity Ratio of Primary Light to Blue Light a/b | Thermal Resistance °C./W | Transmission Factor % | Notes |
|---|---|---|---|---|---|---|---|---|---|---|---|
| Example 1 | 2 | 20 | 0.28 | 0.23 | 0.3 | 0.032 | 0.10 | 0.32 | 7 | 97 | |
| Reference Example 1 | — | — | — | — | — | — | — | — | — | 90 | CCFL |
| Example 2 | 4 | 40 | 0.28 | 0.23 | 0.01 | 0.0026 | 0.08 | 0.0325 | 40 | 99 | |
| Example 3 | 3 | 30 | 0.28 | 0.23 | 0.4 | 0.1 | 0.20 | 0.5 | 4 | 90 | |
| Example 4 | 32 | 45 | 0.28 | 0.23 | 0.01 | 0.021 | 0.70 | 0.03 | 40 | 99 | |
| Comparative Example 1 | 3.2 | 32 | 0.28 | 0.23 | 0.45 | 0.106 | 0.20 | 0.53 | 4 | 87 | |
| Comparative Example 2 | 1.8 | 18 | 0.28 | 0.23 | 0.41 | 0.1 | 0.20 | 0.5 | 40 | 85 | |
| Example 5 | 3.1 | 31 | 0.29 | 0.23 | 0.25 | 0.061 | 0.19 | 0.32 | 4 | 95 | |
| Comparative Example 3 | 1 | 10 | 0.28 | 0.23 | 0.42 | 0.032 | 0.07 | 0.46 | 40 | 85 | |

TABLE 3

| Item | Braun Tube Television | Liquid Crystal Display Television | Plasma Display Television |
|---|---|---|---|
| Brightness | ◯ | ◯ | ◯ |
| Color Reproducing Property | ◯ | ◯ | ◯ |
| Movie Display | ◯ | Δ | ◯ |
| Display of Black Color | ◯ | Δ | ◯ |
| Life | ◯ | ◯ | Δ |
| Energy-Saving Performance | Δ | ◯ | Δ |
| Depth (Thinness) | Δ | ◯ | ◯ |
| Screen Enlargement | ◯ | Δ | ◯ |
| Light Weight | Δ | ◯ | ◯ |

TABLE 4

| Sample No. | Brightness (Cd/m²) | NTSC Ratio (%) |
|---|---|---|
| Example 101 | 210 | 90 |
| Example 102 | 220 | 92 |
| Example 103 | 200 | 93 |
| Example 104 | 240 | 75 |
| Example 105 | 250 | 76 |
| Example 106 | 230 | 75 |
| Example 107 | 220 | 74 |
| Example 108 | 230 | 74 |
| Example 109 | 240 | 75 |
| Example 110 | 240 | 75 |
| Example 111 | 250 | 73 |
| Example 112 | 240 | 74 |
| Example 113 | 250 | 74 |
| Example 114 | 240 | 74 |
| Example 115 | 220 | 80 |
| example 116 | 220 | 75 |
| Example 117 | 230 | 74 |
| Example 118 | 240 | 75 |
| Example 119 | 240 | 76 |
| Example 120 | 250 | 77 |
| Example 121 | 240 | 76 |
| Example 122 | 230 | 75 |
| Comparative Example 101 | 170 | 76 |
| Comparative Example 102 | 150 | 78 |
| Comparative Example 103 | 140 | 80 |
| Comparative Example 104 | 190 | 72 |
| Comparative Example 105 | 190 | 73 |
| Comparative Example 106 | 180 | 72 |
| Comparative Example 107 | 170 | 70 |
| Comparative Example 108 | 190 | 73 |
| Comparative Example 109 | 180 | 72 |
| Comparative Example 110 | 180 | 71 |
| Comparative Example 111 | 200 | 72 |
| Comparative Example 112 | 190 | 70 |
| Comparative Example 113 | 200 | 71 |
| Comparative Example 114 | 190 | 72 |
| Comparative Example 115 | 180 | 76 |
| Comparative Example 116 | 180 | 73 |
| Comparative Example 117 | 180 | 71 |
| Comparative Example 118 | 180 | 70 |
| Comparative Example 119 | 170 | 72 |
| Comparative Example 120 | 180 | 72 |
| Comparative Example 121 | 17 | 73 |
| Comparative Example 122 | 180 | 72 |

TABLE 5

| Sample No. | Luminous Efficiency (lm/W) | Color Reproduction Range (NTSC Ratio) (%) |
|---|---|---|
| Example 201 | 52 | 90 |
| Example 202 | 51 | 92 |
| Example 203 | 50 | 93 |
| Example 204 | 60 | 75 |
| Example 205 | 62 | 76 |
| Example 206 | 59 | 75 |
| Example 207 | 58 | 74 |
| Example 208 | 60 | 74 |
| Example 209 | 62 | 75 |
| Example 210 | 57 | 75 |
| Example 211 | 58 | 78 |
| Comparative Example 201 (CCFL) | 50 | 70 |

The invention claimed is:

1. A light emitting device, comprising:
a laser diode for emitting a laser light having a peak wave length of 360 nm to 420 nm; and
a phosphor layer for being excited by the laser light and emitting blue, green, and red lights, wherein said phosphor constituting the phosphor layer for emitting the green light has at least one composition expressed by general formulas:

$$(Ba_{1-x},Eu_x)(Mg_{1-y},Mn_y)Al_{10}O_{17}$$

wherein x and y respectively satisfy the relations $0.05 < x < 0.5$; and $0.1 < y < 0.6$;

$$(Sr_{2-x-y-z-\omega},Ba_x Mg_y,Mn_z,Eu_\omega)SiO_4$$

wherein x, y, z and ω respectively satisfy the relations $0.05 < x < 1$, $0.05 < y < 0.2$, $0.002 < z < 0.009$, $0.03 < \omega < 0.3$;

$$ZnS:Au_x,Al_y$$

wherein x and y respectively satisfy the relations $0.0002 \leq x \leq 0.015$, $0.0001 \leq y \leq 0.0012$;

$$(Sr_{1-x-y},Ca_x,Eu_y)Ga_2S_4$$

wherein x and y respectively satisfy the relations $x < 0.2$, $0.05 < y < 0.3$; and $$(Sr_{3-x},Eu_x)Si_y Al_z O_v N_\omega$$

wherein x, y, z, v and ω respectively satisfy the relations $x < 0.2$, $12 < y < 14$, $2 < z < 4$, $1 < v < 3$, $20 < \omega < 22$.

2. A light emitting device, comprising:
a laser diode for emitting a laser light having a peak wave length of 360 nm to 420 nm; and
a phosphor layer for being excited by the laser light and emitting blue, green, and red lights, wherein said phosphor constituting the phosphor layer for emitting the red light has at least one composition expressed by general formulas:

$$(La_{1-x},Eu_x Sm_y)_2 O_2 S$$

wherein x and y respectively satisfy the relations $0.01 < x < 0.2$ and $0.00005 < y < 0.05$;

$$(Ca_{1-x},Eu_x)AlSiN_3$$

wherein x satisfies the relation $0.005 < x < 0.03$;

$$(Sr_{2-x-y-z-u},Ca_x Mg_y,Eu_z,Mn_u)SiO_4$$

wherein x, y, z and u respectively satisfy the relations $0.05 < x < 0.4$, $0.005 < y < 0.21$, $0.05 < z < 0.3$, $0.001 < u < 0.04$; and $$(Ba_{3-x-y-z},Sr_x Eu_y,Mn_z)Mg_\omega Si_2 O_8$$

wherein x, y, z and ω respectively satisfy the relations $0 \leq x < 0.2$, $0.02 < y < 0.6$, $0.05 < z < 1.5$, $0.95 < \omega < 1.4$.

3. The light emitting device according to any one of claims 1 and 2, wherein said phosphor layer has a thickness of 0.1 mm or more.

4. The light emitting device according to any one of claims 1 and 2, wherein said light emitting device has a luminous efficiency of 20 lm/W or more.

5. The light emitting device according to any one of claims 1 and 2, wherein a surface of said phosphor layer is further formed with a UV light absorbing layer which is formed by dispersing UV light absorbing powder into a third hardened transparent resin.

6. The light emitting device according to claim 5, wherein said UV light absorbing powder is fine powder composed of inorganic substance selected from a group consisting of titanium oxide, zinc oxide and cerium oxide.

7. A lighting device comprising the light emitting device according to any one of claims 1 and 2.

8. The light emitting device of any one of claims 1 and 2, further comprising:
- a conductive portion;
- a light emitting diode chip, which is mounted on the conductive portion, for emitting a primary light having a peak wavelength of 360 nm to 420 nm;
- a transparent resin layer, which is composed of a first hardened transparent resin, for sealing the light emitting diode chip; and
- a phosphor layer for covering the transparent resin layer, the phosphor layer being formed by dispersing a phosphor powder into a second hardened transparent resin, and the phosphor powder receiving the primary light and radiating a secondary light having a wavelength longer than that of the primary light,
- wherein an energy of the primary light contained in the radiated secondary light is 0.4 mW/lm or less.

9. The light emitting device according to claim 8, wherein said phosphor powder contains a blue phosphor powder for emitting a blue light having a peak wavelength of 430 nm to 460 nm, and a ratio of a peak strength of the primary light with respect to that of the blue light in an emission spectrum of the radiated secondary light is 0.5 or less.

10. The light emitting device according to claim 8, wherein said phosphor powder has an average grain size of 10 μm or more.

11. The light emitting device according to claim 8, wherein said conductive portion is provided on an insulating portion thereby to constitute a substrate, and the insulating portion is either one of an alumina plate, an aluminum nitride plate and a glass epoxy plate provided with a heat radiation via.

12. The light emitting device according to claim 11, wherein a thermal resistance Rth per one light emitting diode chip between a junction portion of the light emitting diode chip and a rear surface of the substrate is 40° C./W or less.

13. The light emitting device according to claim 8, wherein said conductive portion is a light reflecting electrode.

14. The light emitting device according to claim 13, wherein said light reflecting electrode is an electrode composed of at least one metal selected from a group consisting of Ag, Pt, Ru, Pd and Al.

15. The light emitting device according to claim 8, wherein at a surface of said conductive portion is provided with a light reflecting layer.

16. The light emitting device according to claim 15, wherein said light reflecting layer is a cover layer containing fine powder composed of inorganic substance selected from a group consisting of titanium oxide, barium sulphide, alumina and silica.

17. The light emitting device according to claim 15, wherein said light reflecting layer is a cover layer composed of at least one metal selected from a group consisting of Al, Ag, Pt, Ru and Pd.

* * * * *